US011980049B2

(12) United States Patent
Kim

(10) Patent No.: US 11,980,049 B2
(45) Date of Patent: May 7, 2024

(54) DISPLAY DEVICE

(71) Applicant: Samsung Display Co., LTD., Yongin-si (KR)

(72) Inventor: Yun Jae Kim, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 349 days.

(21) Appl. No.: 17/386,401

(22) Filed: Jul. 27, 2021

(65) Prior Publication Data

US 2022/0039267 A1 Feb. 3, 2022

(30) Foreign Application Priority Data

Jul. 30, 2020 (KR) .................... 10-2020-0095335

(51) Int. Cl.
H10K 50/86 (2023.01)
H10K 50/84 (2023.01)
H10K 50/87 (2023.01)
H10K 59/12 (2023.01)

(52) U.S. Cl.
CPC ........... *H10K 50/841* (2023.02); *H10K 50/86* (2023.02); *H10K 50/87* (2023.02); *H10K 59/12* (2023.02)

(58) Field of Classification Search
CPC ...... H10K 50/841; H10K 50/86; H10K 50/87; H10K 59/12; H10K 77/111; H10K 2102/311; H10K 59/60; G06F 1/1652; G09F 9/301; G09F 9/33; H04M 1/0264; H04M 1/0268; Y02E 10/549
See application file for complete search history.

(56) References Cited

U.S. PATENT DOCUMENTS

| 2017/0212613 | A1* | 7/2017 | Hwang | G06F 1/1684 |
| 2018/0255219 | A1* | 9/2018 | Ramaprakash | H04N 23/90 |
| 2019/0243417 | A1* | 8/2019 | Cheng | G06F 1/1686 |
| 2023/0329035 | A1* | 10/2023 | Yun | H10K 59/8792 |

FOREIGN PATENT DOCUMENTS

| CN | 110233167 A | * | 9/2019 | .......... H01L 27/323 |
| KR | 1020180012238 A | | 2/2018 | |
| KR | 1020200019305 A | | 2/2020 | |
| KR | 1020210104517 | | 8/2021 | |
| WO | WO-2020047076 A1 | * | 3/2020 | |
| WO | WO-2020191596 A1 | * | 10/2020 | .......... G06K 9/0004 |

* cited by examiner

*Primary Examiner* — Temesghen Ghebretinsae
*Assistant Examiner* — Karin Kiyabu
(74) *Attorney, Agent, or Firm* — CANTOR COLBURN LLP

(57) ABSTRACT

A foldable display device includes a display panel, a folding line extending in a first direction, a first non-folding area disposed on a first side of the folding line and which extends in a second direction perpendicular to the first direction, a second non-folding area disposed on a second side of the folding line opposite the first side and which extends in the second direction, and a through hole defined in the first non-folding area and which penetrates the display panel in a thickness direction. In a plan view, a first maximum width of the through hole in the first direction is smaller than a second maximum width of the through hole in the second direction.

18 Claims, 17 Drawing Sheets

HLE: HLE_TH, HLE_OP

HLE: HLE_TH, HLE_OP
HLEs: HLE_THs, HLE_OPs

DISPLAY DEVICE

This application claims priority to Korean Patent Application No. 10-2020-0095335, filed on Jul. 30, 2020, and all the benefits accruing therefrom under 35 U.S.C. § 119, the content of which in its entirety is herein incorporated by reference.

BACKGROUND

1. Technical Field

The present disclosure relates to a display device.

2. Description of the Related Art

Electronic devices providing images to users, such as a smartphone, a tablet PC, a digital camera, a laptop computer, a navigation device and a smart television, include display devices for displaying images.

Recently, optical elements such as a camera and an infrared sensor have been mounted on a display device in order to implement various functions other than screen display. The display device may include an optical hole in order for the optical element to receive light. Some members of the display device are physically perforated to increase the transmittance of the optical holes.

Further, recently, a foldable display device has attracted much attention. Since the foldable display device has a wide screen with good portability, it has both advantages of a smartphone and a tablet PC. A folding operation of the foldable display device may apply stress to each layer constituting the display device. If the optical holes undergo such stress, inter-component interference, cracks in a thin film encapsulation layer protecting a light emitting element, peeling of a polarizing member and the like may occur.

SUMMARY

Aspects of the present disclosure provide a display device capable of preventing or suppressing defects caused by external impacts on a window that covers an optical hole.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment of a foldable display device includes a display panel, a folding line extending in a first direction, a first non-folding area disposed on a first side of the folding line and which extends in a second direction perpendicular to the first direction, a second non-folding area disposed on a second side of the folding line opposite the first side and which extends in the second direction, and a through hole defined in the first non-folding area and which penetrates the display panel in a thickness direction. In a plan view, a first maximum width of the through hole in the first direction is smaller than a second maximum width thereof in the second direction.

In an embodiment of a display device including a folding line extending in a first direction and a hole area disposed on a first side of the folding line, the display device includes a display panel, a cover window disposed on the display panel and a printed layer disposed on the cover window. The hole area includes a through hole which penetrates the display panel in a thickness direction, and an optical hole defined by the printed layer, the optical hole overlaps the through hole, and in the plan view, a first maximum width of the optical hole in the first direction is smaller than a second maximum width of the optical hole in a second direction perpendicular to the first direction.

In accordance with the display device according to an embodiment, it is possible to provide the display device capable of preventing or suppressing defects caused by external impacts on the window that covers the optical hole.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
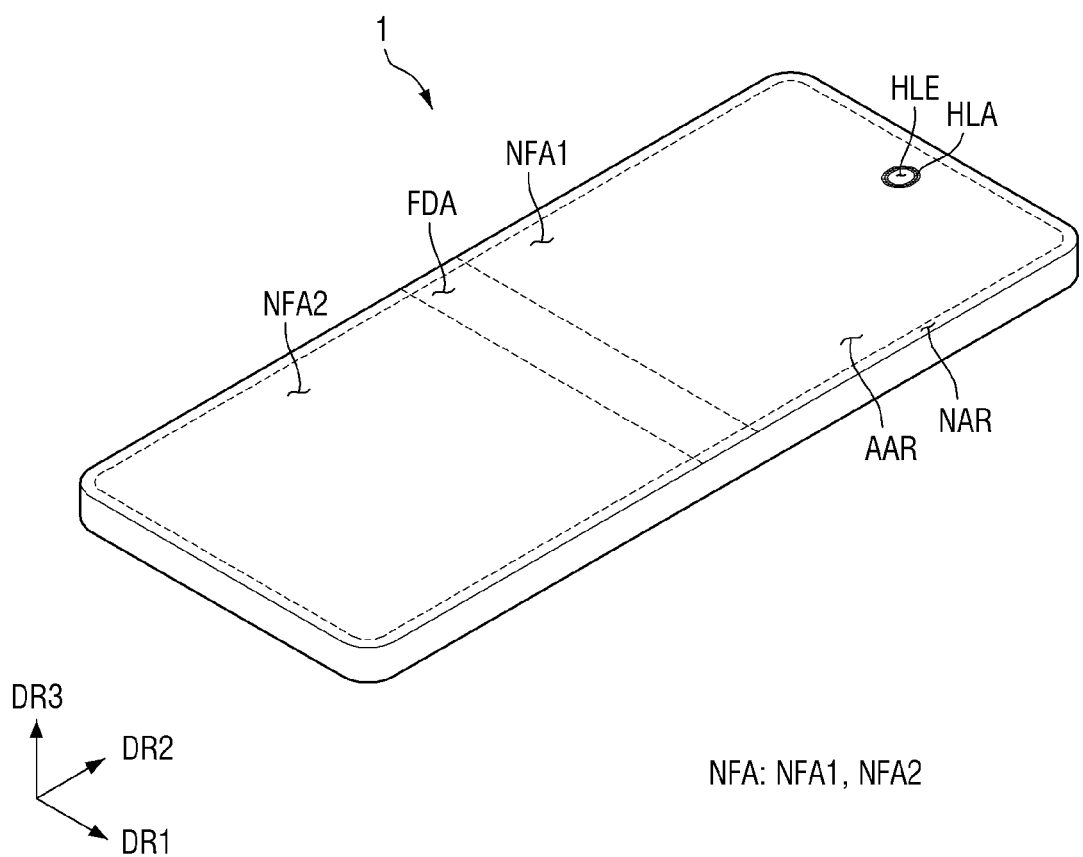
FIG. 1 is a perspective view illustrating an unfolded state of a display device according to an embodiment.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on another layer or substrate, or intervening layers may also be present. The same reference numbers indicate the same components throughout the specification. In the attached figures, the thickness of layers and regions is exaggerated for clarity. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, embodiments will be described in detail with reference to the accompanying drawings.

Figure 2:
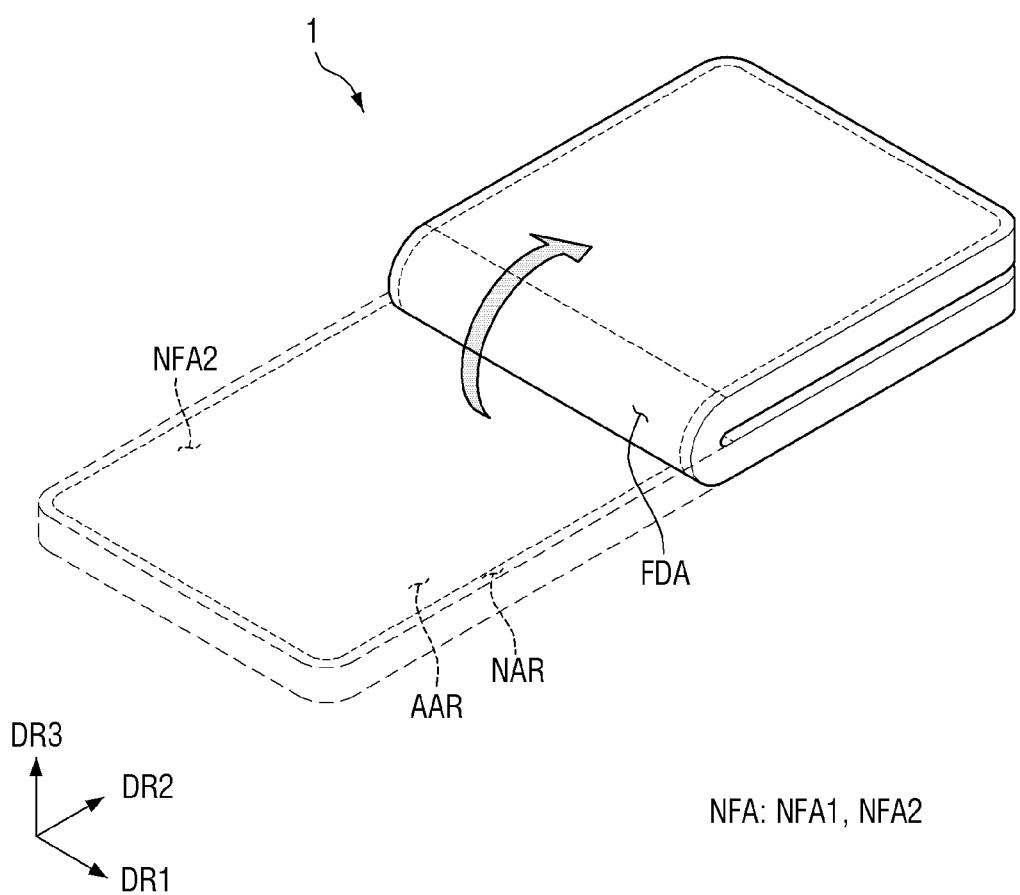
FIG. 2 is a perspective view illustrating a folded state of a display device according to an embodiment.

FIG. 1 is a perspective view illustrating an unfolded state of a display device according to an embodiment. FIG. 2 is a perspective view illustrating a folded state of a display device according to an embodiment. In FIG. 2, a display device 1 according to an embodiment is illustrated as being "in-folded".

Referring to FIGS. 1 and 2, a first direction DR1 may be a direction parallel to one side of the display device 1 in a plan view and may be, for example, a horizontal direction (i.e., latitudinal direction) of the display device 1. A second direction DR2 may be a direction parallel to another side in contact with the one side of the display device 1 in a plan view and may be, for example, a vertical direction (i.e., longitudinal direction) of the display device 1. A third direction DR3 may be a thickness direction of the display device 1 and perpendicular to the plan defined by the first and second directions DR1 and DR2. It should be understood, however, that a direction mentioned in the embodiment refers to a relative direction and the embodiment is not limited to the direction mentioned.

The display device 1 according to an embodiment displays a screen or an image through an active region AAR (to be described later), and various devices including the active region AAR may be included therein. For example, the display device 1 according to embodiments of the present disclosure may be applied to a smartphone, a mobile phone, a tablet PC, a personal digital assistant ("PDA"), a portable multimedia player ("PMP"), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator and a washing machine, or an Internet-of-Things device.

The display device 1 may have a rectangular or square shape in a plan view. The display device 1 may have a rectangular shape with right-angled or rounded corners in a plan view. The display device 1 may include two long sides disposed on opposite sides in the horizontal direction (i.e., first direction DR1), respectively, and two short sides disposed on opposite sides in the vertical direction (second direction DR2), respectively.

The display device 1 includes an active region AAR and a non-active region NAR. The active region AAR of the display device 1 may include a display area displaying a screen (i.e., image). Further, when the display device 1 has a touch function, a touch area, which is an area where a touch input is sensed, may also be included in the active region AAR.

The shape of the active region AAR may correspond to the shape of the display device 1 to which the active region AAR is applied. For example, when the display device 1 is rectangular in a plan view, the shape of the active region AAR may also be rectangular.

The active region AAR may include a plurality of pixels. The plurality of pixels may be arranged in a matrix. The shape of each pixel may be a rectangular or square shape in a plan view. However, the present disclosure according to the invention is not limited thereto.

The non-active region NAR may surround the periphery of the active region AAR. The non-active region NAR may include a non-display area where no display of the image by the pixels is performed. The non-active region NAR may surround all sides of the active region AAR, but the present disclosure according to the invention is not limited thereto. The non-active region NAR may not be disposed in the vicinity of at least a part of the four sides of the active region AAR. A bezel area of the display device 1 may be configured as the non-active region NAR. A printed layer ('IN' in FIG. 6), which will be described later, may be overlappingly disposed in the non-active region NAR.

The display device 1 may include a hole area HLA defining at least one hole HLE therein. The hole area HLA is disposed to overlap an optical element ('OPS' in FIG. 6) in the thickness direction (i.e., third direction DR3) to transmit light to a light receiving portion of the optical element ('OPS' in FIG. 6). In the drawing, the display device 1 is illustrated as including one hole area HLA, but the invention is not limited thereto. The display device 1 may include a plurality of hole areas HLA in another embodiment.

The hole area HLA may be disposed inside the active region AAR. The hole area HLA may be at least partially surrounded by the active region AAR. Although it is illustrated in the drawing that the active region AAR completely surrounds the periphery of the hole area HLA, a part of the hole area HLA may be connected to the non-active region NAR disposed in the periphery (or edges) of the active region AAR in another embodiment. The hole area HLA may correspond to the non-active region NAR where no display of the image by the pixels is performed, although not limited thereto. In another embodiment, the hole area HLA may be the active region AAR which itself displays a screen (i.e., image).

The display device 1 may be a foldable display device. As used herein, the term "foldable display device" refers to a display device which can be folded and may have both a folded state and an unfolded state. Further, the folding typically includes folding at an angle of about 180 degrees. However, the present disclosure according to the invention is not limited thereto, and it may include a case where the folding angle is less than 180 degrees, for example, a case where the folding angle is equal to or greater than 90 degrees and less than 180 degrees, or a case where the folding angle is equal to or greater than 120 degrees and less than 180 degrees. In addition, it may be referred to as a folded state if folding is performed out of the unfolded state, even if complete folding is not performed. For example, even if it is folded at an angle of 90 degrees or less, as long as the maximum folding angle becomes 90 degrees or more, it may be expressed as being in a folded state to distinguish it from the unfolded state.

The display device 1 may include a folding area FDA (in other words, folding line). The display device 1 may be folded with respect to the folding area FDA. The folding may be classified into in-folding in which the display surface of the display device 1 is folded inward and out-folding in which the display surface of the display device 1 is folded outward. Although FIG. 2 illustrates that the display device 1 is in-folded, the present disclosure according to the invention is not limited thereto. The display device 1 may be folded in an out-folding manner in another embodiment.

Further, the display device 1 may be folded in only one manner, i.e., an in-folding manner or out-folding manner. Alternatively, both the in-folding and the out-folding may be performed. In the case of the display device in which both in-folding and out-folding are performed, in-folding and out-folding may be performed with respect to the same folding area FDA. Alternatively, it may include a plurality of folding areas, such as a folding area for in-folding only and a folding area for out-folding only, which are used to perform different types of folding.

The folding area FDA may have an extending direction parallel to one side of the display device 1. For example, the folding area FDA may extend in the same direction (i.e., first direction DR1) as a horizontal direction of the display device 1. When the display device 1, which is exemplarily illustrated in the drawing to have a rectangular shape in which the side in the vertical direction (i.e., second direction DR2) are longer than the side in the horizontal direction (i.e., first direction DR1), has the folding area FDA extending in the horizontal direction (i.e., first direction DR1), the long side of the display device 1 may be reduced to half or less, while the short side thereof may remain the same, after the display device 1 is folded. In another embodiment, the folding area FDA may extend in the same direction (i.e., second direction DR2) as the extension direction of the long side.

The folding area FDA may also have a predetermined width in the second direction DR2. The width of the folding area FDA in the second direction DR2 may be much smaller than the width of the folding area FDA in the first direction DR1.

The display device 1 may include a non-folding area NFA disposed around the folding area FDA. The non-folding area NFA may include a first non-folding area NFA1 located on one side of the folding area FDA in the second direction DR2 and a second non-folding area NFA2 located on the other side of the folding area FDA in the second direction DR2. The widths of the first non-folding area NFA1 and the second non-folding area NFA2 in the second direction DR2 may be equal to each other, but the present disclosure according to the invention is not limited thereto. The width of the first non-folding area NFA1 and the width of the second non-folding area NFA2 may be different from each other according to the position of the folding area FDA in another embodiment.

The active region AAR/non-active region NAR and the folding area FDA/non-folding area NFA of the display device 1 described above may overlap each other at the same position in a plan view. For example, a specific position may be located in the active region AAR and also located in the first non-folding area NFA1. Another specific position may be located in the non-active region NAR and also located in the first non-folding area NFA1. Still another specific position may be located in the active region AAR and also located in a region including the folding area FDA.

The active region AAR of the display device 1 may be disposed over both the first non-folding area NFA1 and the second non-folding area NFA2. Further, the active region AAR may be located even in the folding area FDA corresponding to a boundary between the first non-folding area NFA1 and the second non-folding area NFA2. That is, the active region AAR of the display device 1 may be continuously arranged irrespective of boundaries of the non-folding area NFA, the folding area FDA and the like. However, the present disclosure according to the invention is not limited thereto. The active region AAR may be located in only one of the first non-folding area NFA1 and the second non-folding area NFA2 in another embodiment. The active region AAR may be disposed in the first non-folding area NFA1 and the second non-folding area NFA2, but the active region AAR may not be disposed in the folding area FDA.

The hole area HLA may be disposed in at least one of the first non-folding area NFA1 and the second non-folding area NFA2. For example, the hole area HLA may be disposed in the first non-folding area NFA1, although not limited thereto. The hole area HLA is spaced apart from the folding area FDA.

Hereinafter, the cross-sectional structure of the above-described display device 1 will be described.

Figure 3:
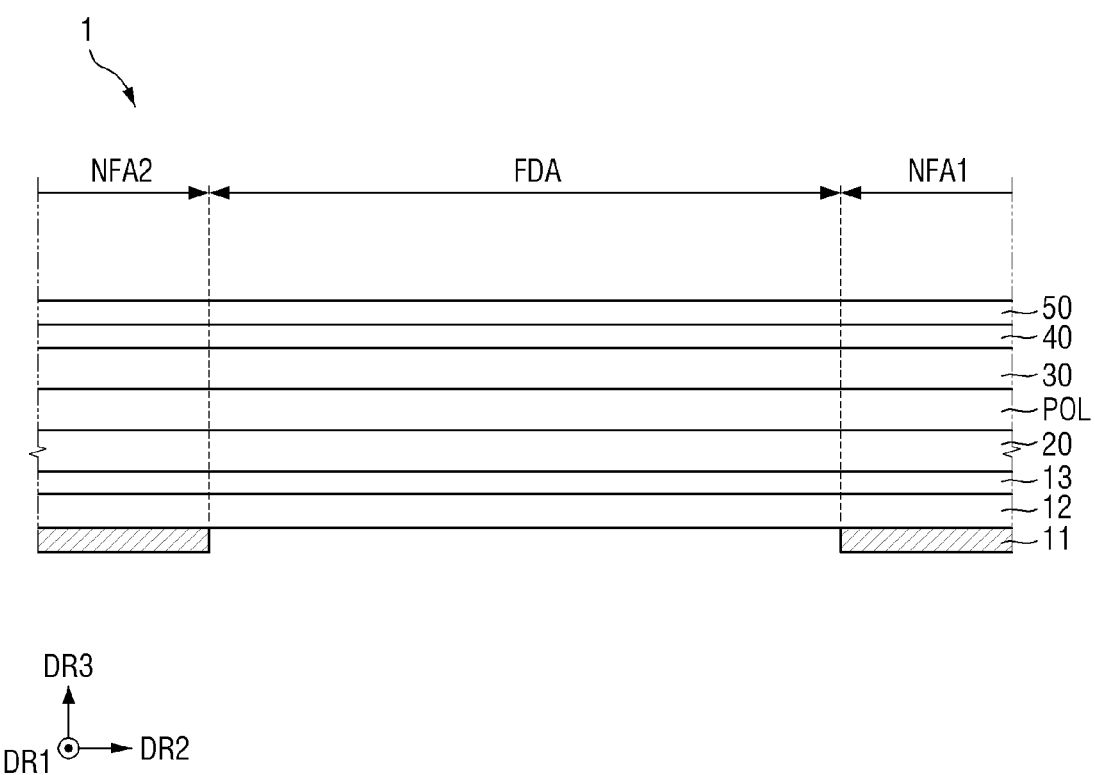
FIG. 3 is a cross-sectional view of a display device in an unfolded state according to an embodiment.
Figure 4:
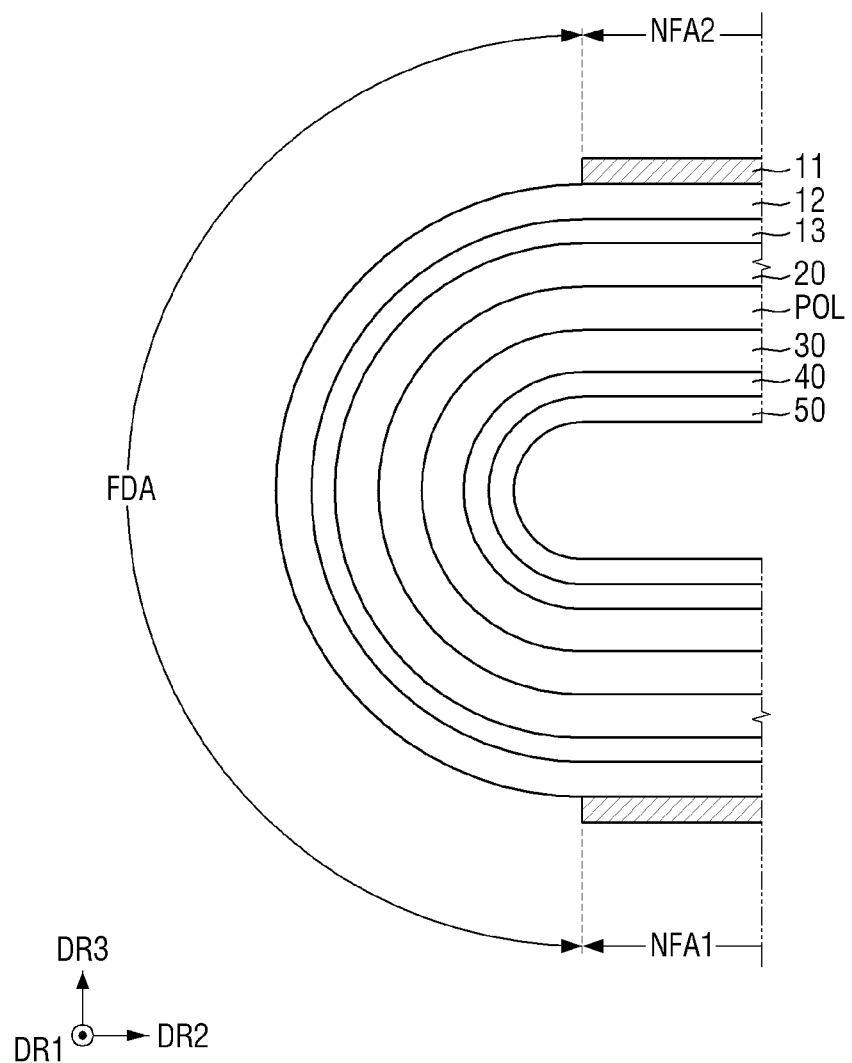
FIG. 4 is a cross-sectional view of a display device in a folded state according to an embodiment.

FIG. 3 is a cross-sectional view of a display device in an unfolded state according to an embodiment. FIG. 4 is a cross-sectional view of a display device in a folded state according to an embodiment.

Referring to FIGS. 3 and 4, the display device 1 may include a display panel 20; an anti-reflection member POL, an impact absorbing layer 30, a cover window 40 and a cover window protection layer 50 sequentially stacked on one side of the display panel 20 in the thickness direction (i.e., third direction DR3); and a polymer film layer 13, a cushion layer 12, and a heat dissipation member 11 sequentially stacked on the other side of the display panel 20 in the thickness direction (i.e., third direction DR3).

At least one bonding member such as an adhesive layer or a tackifying layer may be disposed between the stacked members to bond the adjacent stacked members. The display device 1 may include, for example, a first bonding member PSA1 (see FIG. 6) disposed between the anti-reflection member POL and the impact absorbing layer 30, a second bonding member PSA2 (see FIG. 6) disposed between the impact absorbing layer 30 and the cover window 40, and a third bonding member PSA3 (see FIG. 6) disposed between the cover window 40 and the cover window protection layer 50. However, the present disclosure according to the invention is not limited thereto, and another layer may be further disposed between the respective layers, and some of the stacked members may be omitted.

The display panel 20 is a panel for displaying a screen or an image. Examples of the display panel 20 may include not only a self-luminous display panel such as an organic light emitting display ("OLED") panel, an inorganic electroluminescence ("EL") display panel, a quantum dot ("QED") display panel, a micro-LED display panel, a nano-LED display panel, a plasma display panel ("PDP"), a field emission display ("FED") panel and a cathode ray tube ("CRT") display panel, but also a light receiving display panel such as a liquid crystal display ("LCD") panel and an electrophoretic display ("EPD") panel. Hereinafter, the organic light emitting display panel will be described as an example of the display panel 20, and the organic light emitting display panel applied to the embodiment will be simply referred to as a display panel unless special distinction is required. However, the embodiment is not limited to the organic light emitting display panel, and other display panels mentioned above or known in the art may be applied within the scope of the same technical ideas. A detailed structure of the display panel 20 will be described later.

An anti-reflection member POL may be disposed on the display panel 20. The anti-reflection member POL may serve to reduce reflection of external light. The anti-reflection member POL may be provided in the form of a polarizing film. In this case, the anti-reflection member POL polarizes light passing therethrough. The present disclosure according to the invention is not limited thereto, and the anti-reflection member POL may be provided as a color filter layer in the display panel 20.

The impact absorbing layer 30 may be disposed on the anti-reflection member POL. The impact absorbing layer 30 may serve to increase the durability of the cover window 40 and improve the optical performance. The impact absorbing layer 30 may be optically transparent. The impact absorbing layer 30 may be omitted.

The cover window 40 may be disposed on the impact absorbing layer 30. The cover window 40 serves to cover and protect the display panel 20. The cover window 40 may be made of a transparent material. The cover window 40 may include, for example, glass or plastic.

When the cover window 40 includes glass, the glass may be ultra-thin glass ("UTG") or thin glass. When the cover window 40 includes plastic, the plastic may be transparent polyimide or the like, but the invention is not limited thereto. The cover window 40 may have a flexible property such that it can be twisted, bent, folded, or rolled.

The cover window protection layer 50 may be disposed on the cover window 40. The cover window protection layer 50 may perform at least one of functions of prevention of scattering, impact absorption, prevention of scratch, prevention of fingerprint smudges and prevention of glare on the cover window 40. The cover window protection layer 50 may be formed to include a transparent polymer film. The cover window protection layer 50 may be omitted.

The polymer film layer 13 may be disposed below the display panel 20. The polymer film layer 13 may include, for example, polyimide ("PI"), polyethylene terephthalate ("PET"), polycarbonate ("PC"), polyethylene ("PE"), polypropylene ("PP"), polysulfone ("PSF"), polymethylmethacrylate ("PMMA"), triacetylcellulose ("TAC"), cycloolefin polymer ("COP"), or the like. The polymer film layer 13 may include a functional layer on at least one surface of the polymer film layer 13. The functional layer may include, for example, a light absorbing layer. The light absorbing layer may include a light absorbing material such as a black pigment or dye. The light absorbing layer may be formed by coating or printing black ink on a polymer film.

The cushion layer 12 may be disposed below the polymer film layer 13. The cushion layer 12 may serve to increase the durability against an impact that may be applied in the thickness direction (i.e., third direction DR3) of the display device 1, and to relieve a drop impact of the display device 1 when the display device 1 is dropped. The cushion layer 12 may include polyurethane or the like.

The heat dissipation member 11 may be disposed below the polymer film layer 13. The heat dissipation member 11 serves to diffuse heat generated from the display panel 20 or other components of the display device 1. The heat dissipation member 11 may include a metal plate. The metal plate may include, for example, a metal having excellent thermal conductivity, such as copper and silver. The heat dissipation member 11 may include a heat dissipation sheet including graphite, carbon nanotubes or the like.

In order to facilitate the folding of the display device 1, some layers of the display device 1 may be separated by the folding area FDA. For example, the heat dissipation member 11 constituting the lowermost layer of the display device 1 and having low ductility may be separated by the folding area FDA (See FIG. 4).

The cushion layer 12 or the polymer film layer 13 may also be separated by the folding area FDA. However, if it has sufficient ductility, it may have an integrally connected shape regardless of the folding area FDA and the non-folding area NFA.

When the display device 1 is in-folded with respect to the folding area FDA, the second non-folding area NFA2 may overlap the first non-folding area NFA1 in the thickness direction as shown in FIG. 4. Unlike the separated heat dissipation member 11, the display panel 20, the polymer film layer 13, the cushion layer 12, the anti-reflection member POL, the impact absorbing layer 30, the cover window 40 and the cover window protection layer 50, which are continuously formed regardless of the folding area FDA, may be bent to form a cross-sectional curve in the width direction of the folding area FDA.

Stress may be applied to each layer when the layer is bent by the folding operation. Layers near the hole HLE in the hole area HLA may slip by stress applied to each of the layers, and the slip phenomenon may cause defects such as interference between each layer and components (e.g., optical element OPS (see FIG. 6)), an optical shadow or the like in the hole area HLA.

In order to suppress or prevent this, a through hole HLE_TH (see FIGS. 5 and 6) and an optical hole HLE_OP (see FIGS. 5 and 6) located in the hole area HLA may be defined to have a large planar area. However, when the through hole HLE_TH (see FIGS. 5 and 6) and the optical hole HLE_OP (see FIGS. 5 and 6) are defined to be large in size, the cover window 40 or the like covering the holes may be easily weakened by external pressures or impacts. Therefore, in an embodiment, a width in a direction (i.e., second direction DR2) substantially perpendicular to a direction (i.e., first direction DR1) in which the folding line FDA extends may be formed to be greater than a width in a direction (i.e., first direction DR1) substantially the same as the direction (i.e., first direction DR1) in which the folding line FDA extends. Accordingly, it is possible to prevent or suppress defects due to external pressures or impacts, while preventing or suppressing the defects due to the interference, the optical shadow or the like. A more detailed description thereof will be made with reference to FIGS. 5 and 6.

Figure 5:
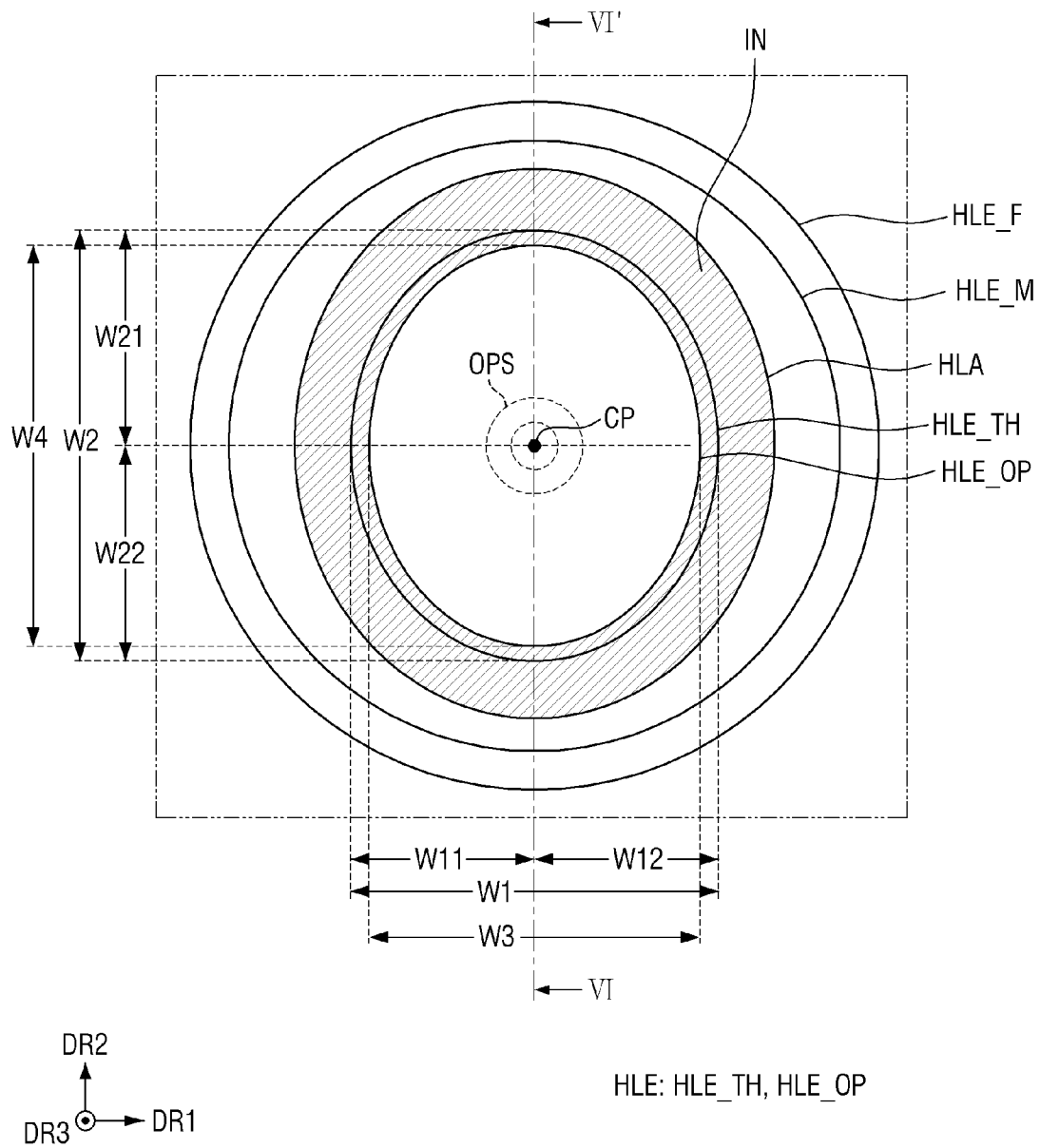
FIG. 5 is a plan view showing a planar arrangement relationship between members around a hole area.
Figure 6:
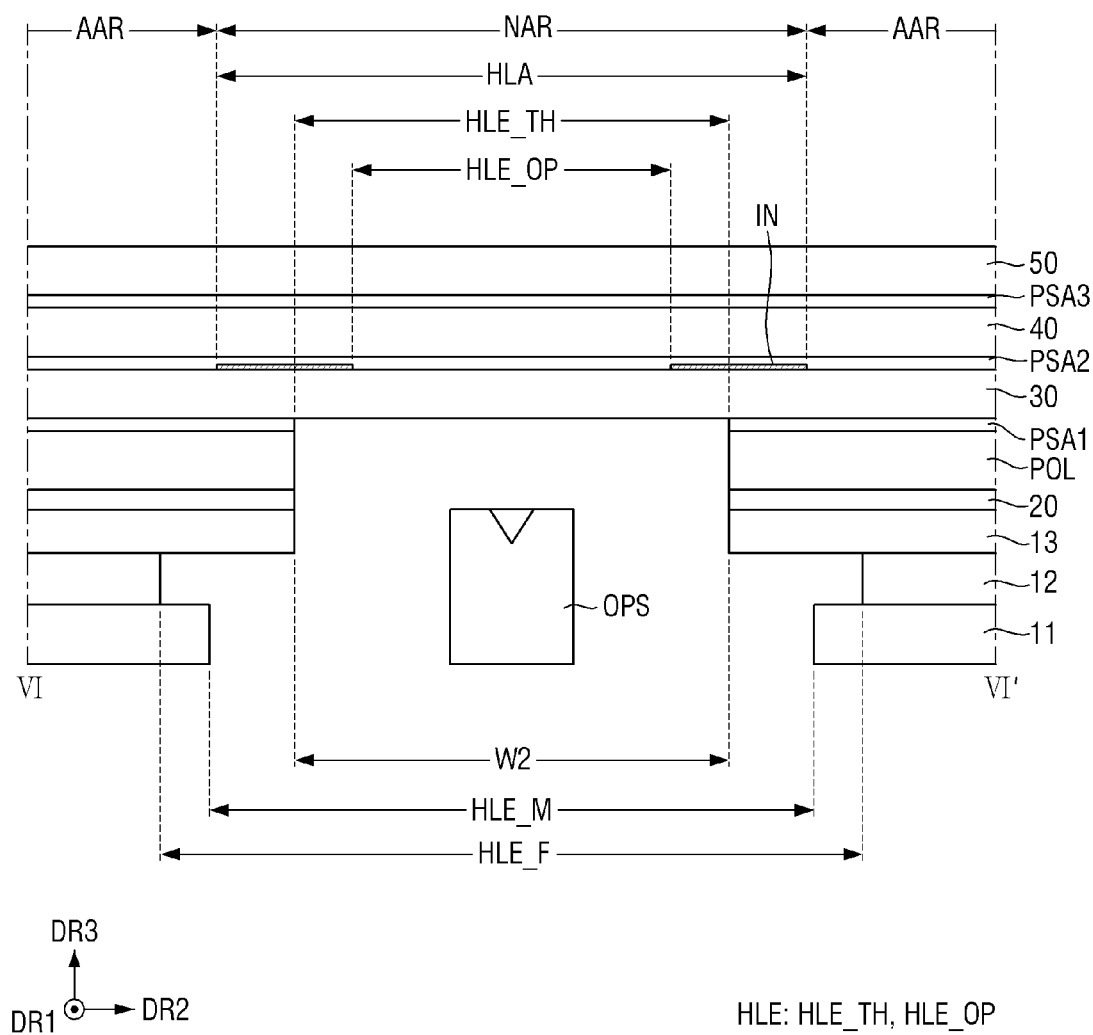
FIG. 6 is a cross-sectional view taken along line VI-VI' of FIG. 5.

FIG. 5 is a plan view showing a planar arrangement relationship between members around a hole area. FIG. 6 is a cross-sectional view taken along line VI-VI' of FIG. 5.

Referring to FIGS. 5 and 6, the hole area HLA may define at least one hole HLE. The hole area HLA may have a shape such as a circle, or an ellipse, a dumbbell and a rectangle with convex short sides in a plan view. However, the present disclosure according to the invention is not limited thereto, and various modifications such as a rectangle, a square, and other polygons are possible. The hole HLE of the hole area HLA may also have a circular shape, an elliptical shape or the like in a plan view.

The hole HLE may include the physical through hole HLE_TH. The through hole HLE_TH may physically penetrate the polymer film layer 13, the display panel 20, and the anti-reflection member POL. As parts of the above-mentioned layers (i.e., the polymer film layer 13, the display panel 20, and the anti-reflection member POL) are removed to define the through hole HLE_TH, the light transmittance in the corresponding region can be improved.

The through hole HLE_TH may have a width W1 in the first direction DR1 and a width W2 in the second direction DR2, which are different in a plan view. In the through hole HLE_TH, the width W2 in the direction (second direction DR2) substantially perpendicular to the direction (first direction DR1) in which the folding area FDA extends may be greater than the width W1 in the direction substantially the same as the direction (first direction DR1) in which the folding area FDA extends. The through hole HLE_TH may have, for example, an elliptical shape in a plan view, in which the width (second width W2) in the second direction DR2 is greater than the width (first width W1) in the first direction DR1, but the invention is not limited thereto.

Specifically, the through hole HLE_TH may include the first width W1 in the first direction DR1 and the second width W2 in the second direction DR2. When the through hole HLE_TH has an elliptical shape in a plan view, the first width W1 (in other words, first maximum width) refers to the greatest width in the first direction DR1, and the second width W2 (in other words, second maximum width) refers to the greatest width in the second direction DR2 of the through hole HLE_TH. In addition, the first width W1 and the second width W2 may pass through a center point CP of the through hole HLE_TH.

The first width W1 of the through hole HLE_TH refers to the width of the through hole HLE_TH in the first direction DR1, and the second width W2 of the through hole HLE_TH refers to the width of the through hole HLE_TH in the second width W2. That is, the first width W1 of the through hole HLE_TH refers to the width in the direction substantially the same as the direction (i.e., first direction DR1) in which the folding area FDA extends, and the second width W2 of the through hole HLE_TH refers to the width in the direction (i.e., second direction DR2) substantially perpendicular to the direction in which the folding area FDA extends.

The first and second widths W1 and W2 of the through hole HLE_TH may have different lengths. The second width W2 of the through hole HLE_TH may be greater than the first width W1 of the through hole HLE_TH. That is, in the through hole HLE_TH having the first width W1 and the second width W2, the width (i.e., second width W2) in the direction substantially perpendicular to the direction (i.e., first direction DR1) in which the folding area FDA extends may be greater than the width (i.e., first width W1) in the direction substantially the same as the direction (i.e., first direction DR1) in which the folding area FDA extends.

The first width W1 of the through hole HLE_TH may be, for example, in a range of 2.7 to 3.8 millimeters (mm) or in a range of 1.5 to 4.5 mm, but the invention is not limited thereto. The second width W2 of the through hole HLE_TH may be, for example, in a range of 3 to 4 mm or in a range of 2 to 5 mm. The second width W2 of the through hole HLE_TH may be in a range of 1.05 to 1.2 times or 1.03 to 1.5 times the first width W1 thereof, but the invention is not limited thereto.

The center point CP may be located inside the through hole HLE_TH in a plan view. The center point CP may be located at a point that bisects the width (e.g., first width W1) of the through hole HLE_TH in the first direction DR1 and bisects the width (e.g., second width W2) of the through hole HLE_TH in the second direction DR2. That is, a first part W11 and a second part W12 of the first width W1 which is bisected by the center point CP may have the same length, and a first part W21 and a second part W22 of the second width W2 which is bisected by the center point CP may have the same length.

Two regions of the through hole HLE_TH, which are located on one side and the other side in the second direction DR2, may have symmetrical shapes in a plan view with respect to an imaginary line extending in the first direction DR1 from the center point CP. Further, two regions of the through hole HLE_TH, which are located on one side and the other side in the first direction DR1, may have symmetrical shapes in a plan view with respect to an imaginary line extending in the second direction DR2 from the center point CP.

The two regions of the through hole HLE_TH, which are located on the one side and the other side in the first direction DR1 with respect to the center point CP, may have the same planar area, and the two regions of the through hole HLE_TH, which are located on the one side and the other side in the second direction DR2 with respect to the center point CP, may have the same planar area in a plan view. That is, the areas of the through hole HLE_TH bisected by the imaginary line extending in the first direction DR1 from the center point CP may be the same, and the areas of the through hole HLE_TH bisected by the imaginary line extending in the second direction DR2 from the center point CP may be the same.

When the through hole HLE_TH has an elliptical shape in a plan view, in the rim of the through hole HLE_TH in a plan view, at two points which are on one side and the other side in the first direction DR1 with respect to the center point CP, tangent lines may be drawn to extend in a direction substantially the same as the second direction DR2, and at two points which are on one side and the other side in the second direction DR2 with respect to the center point CP, tangent lines may be drawn to extend in a direction substantially the same as the first direction DR1.

In a region where the cover window 40 overlaps the through hole HLE_TH, the cover window 40 may not be physically penetrated. Since a window substrate of the cover window 40 itself has high light transmittance, it may maintain high light transmittance even if it is not physically penetrated. In addition, in the corresponding region, as the cover window 40 physically covers lower members without being penetrated, the lower members may be protected.

The display device 1 may further include the first bonding member PSA1, the second bonding member PSA2, and the third bonding member PSA3. The first bonding member PSA1 bonds the anti-reflection member POL to the impact absorbing layer 30 between the anti-reflection member POL and the impact absorbing layer 30. The second bonding member PSA2 bonds the impact absorbing layer 30 to the cover window 40 between the impact absorbing layer 30 and the cover window 40. The third bonding member PSA3 bonds the cover window 40 to the cover window protection layer 50 between the cover window 40 and the cover window protection layer 50.

The first bonding member PSA1 may be physically penetrated in a region where it overlaps the through hole HLE_TH in a plan view, but according to the invention is not limited thereto. When the first bonding member PSA1 is optically transparent, it may not be physically penetrated in the region. The second and third bonding members PSA2 and PSA3 may not be physically penetrated in a region where they overlap the through hole HLE_TH in a plan view. In this case, the second and third bonding members PSA2 and PSA3 may be optically transparent.

The display device 1 may further include the printed layer IN. The printed layer IN may be arranged on the impact absorbing layer 30. The printed layer IN may be arranged on one surface and/or the other surface of the impact absorbing layer 30. However, the present disclosure according to the invention is not limited thereto, and the printed layer IN may be arranged on one surface and/or the other surface of the cover window 40, or on one surface and/or the other surface of the cover window protection layer 50. The printed layer IN may be arranged in the hole area HLA. Further, although not shown, the printed layer IN may be arranged on the edge portion of the impact absorbing layer 30. The printed layer IN may be a light blocking layer or a decorative layer providing an aesthetic appeal.

The hole area HLA may further include the optical hole HLE_OP which is an optical light transmitting window in addition to the through hole HLE_TH. The optical hole HLE_OP may overlap the through hole HLE_TH in a plan view and may be defined by a pattern of the printed layer IN. The printed layer IN may be disposed partially in the hole area HLA to prevent light from being emitted through the through hole HLE_TH (e.g., light leakage phenomenon). The printed layer IN of the hole area HLA may partially overlap the through hole HLE_TH. In other words, an inner surface of the printed layer IN may further protrude inward from an inner wall of the through hole HLE_TH. The printed layer IN may be disposed to extend up to the outer periphery of the hole area HLA, but the present disclosure according to the invention is not limited thereto.

The planar shape of the optical hole HLE_OP may correspond to the planar shape of the through hole HLE_TH in a plan view, but the invention is not limited thereto. The optical hole HLE_OP may have, for example, an elliptical shape in a plan view, in which a width (i.e., fourth width W4) in the second direction DR2 is greater than a width (i.e., third width W3) in the first direction DR1, but the invention is not limited thereto.

When the planar shape of the optical hole HLE_OP corresponds to the planar shape of the through hole HLE_TH, the optical hole HLE_OP may include the third width W3 and the fourth width W4. The third width W3 (in other words, third maximum width) of the optical hole HLE_OP refers to the greatest width of the optical hole HLE_OP in the first direction DR1, and the fourth width W4 (in other words, fourth maximum width) of the optical hole HLE_OP refers to the greatest width of the optical hole HLE_OP in the second direction DR2. The third width W3 of the optical hole HLE_OP may be a width in a direction substantially the same as the direction (i.e., first direction DR1) in which the folding area FDA extends, and the fourth width W4 of the optical hole HLE_OP may be a width in a direction substantially perpendicular to the direction (i.e., first direction DR1) in which the folding area FDA extends.

The third and fourth widths W3 and W4 of the optical hole HLE_OP may have different lengths. The fourth width W4 of the optical hole HLE_OP may be greater than the third width W3 of the optical hole HLE_OP. That is, in the optical hole HLE_OP having the third and fourth widths W3 and W4, the width (i.e., fourth width W4) in the direction substantially perpendicular to the direction (i.e., first direction DR1) in which the folding area FDA extends may be greater than the width (i.e., third width W3) in the direction substantially the same as the direction (i.e., first direction DR1) in which the folding area FDA extends.

The third width W3 of the optical hole HLE_OP may be, for example, in a range of 2.4 to 3.5 mm or in a range of 1.2 to 4.3 mm, but the invention is not limited thereto. The fourth width W4 of the optical hole HLE_OP may be, for example, in a range of 2.7 to 3.8 mm or in a range of 1.7 to 3.8 mm. The fourth width W4 of the optical hole HLE_OP may be in a range of 1.05 to 1.2 times or 1.01 to 1.7 times the third width W3 thereof, but the invention is not limited thereto.

In addition, when the planar shape of the optical hole HLE_OP corresponds to the planar shape of the through hole HLE_TH, the description of the center point CP and the through hole HLE_TH may also be applied to the center point CP and the optical hole HLE_OP.

The display device 1 may further define a first lower through hole HLE_M which physically penetrates the heat dissipation member 11, and a second lower through hole HLE_F which physically penetrates the cushion layer 12. As parts of the heat dissipation member 11 and the cushion layer 12 are removed to define the first lower through hole HLE_M and the second lower through hole HLE_F, the corresponding regions may be provided as a space in which the optical element OPS may be arranged.

In a plan view, the first lower through hole HLE_M may be arranged outside the through hole HLE_TH to surround the through hole HLE_TH, and the second lower through hole HLE_F may be arranged outside the first lower through hole HLE_M to surround the first lower through hole HLE_M.

The planar shapes of the first and second lower through holes HLE_M and HLE_F may be different from the planar shape of the through hole HLE_TH without corresponding to the planar shape of the through hole HLE_TH. The first and second lower through holes HLE_M and HLE_F may have a circular shape in a plan view, which has the same widths in the first direction DR1 and the second direction DR2, but the invention is not limited thereto. However, without being limited thereto, the planar shapes of the first and second lower through holes HLE_M and HLE_F may correspond to the planar shape of the through hole HLE_TH.

The hole HLE may include the physical through hole HLE_TH. The through hole HLE_TH may be a hole that physically penetrates the polymer film layer 13, the display panel 20, and the anti-reflection member POL. As parts of the above-mentioned layers are removed to define the through hole HLE_TH, the light transmittance in the corresponding region can be improved.

The display device 1 may further include the optical element OPS including a light receiving portion. Examples of the optical element OPS including the light receiving portion may include a camera, a lens (a condenser lens or an optical path guide lens), and an optical sensor such as an infrared sensor, an iris recognition sensor and an illuminance sensor. The optical element OPS may be disposed to overlap the hole area HLA on the other surface side of the display panel 20. The light receiving portion of the optical element OPS may be partly or entirely located in the optical hole HLE_OP. Light L (See FIG. 8) from the outside of the display device 1 may pass through the cover window protection layer 50, the cover window 40, and the impact absorbing layer 30 surrounded by the printed layer IN and enter the light receiving portion through the through hole HLE_TH therebelow. As described above, when the cover window 40 exhibits a high light transmittance, external light may reach the light receiving portion of the optical element OPS through the above-described optical path without significant loss.

The optical element OPS may be located in the through hole HLE_TH. In this case, when the second width W2 of the through hole HLE_TH is greater than the first width W1 of the through hole HLE_TH, and the fourth width W4 of the optical hole HLE_OP is greater than the third width W3 of the optical hole HLE_OP, it is possible to suppress or prevent defects such as interference due to contact between the optical element OPS and peripheral components, the optical shadow or the like, despite folding of the display device 1. The description thereof is made with further reference to FIGS. 7 and 8.

Figure 7:
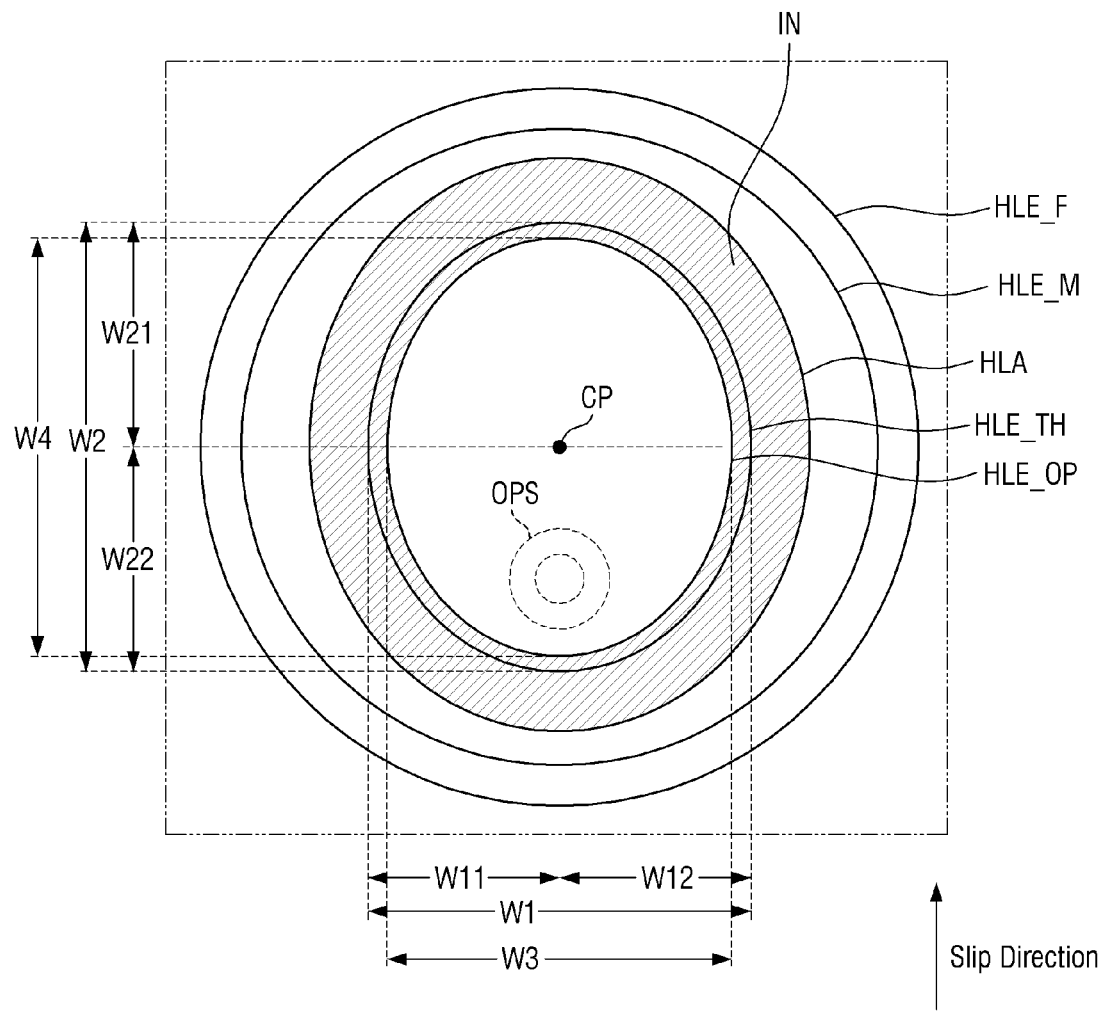
FIG. 7 is a plan view showing a planar arrangement relationship between members around a hole area in a state where the display device of FIG. 5 is folded.
Figure 8:
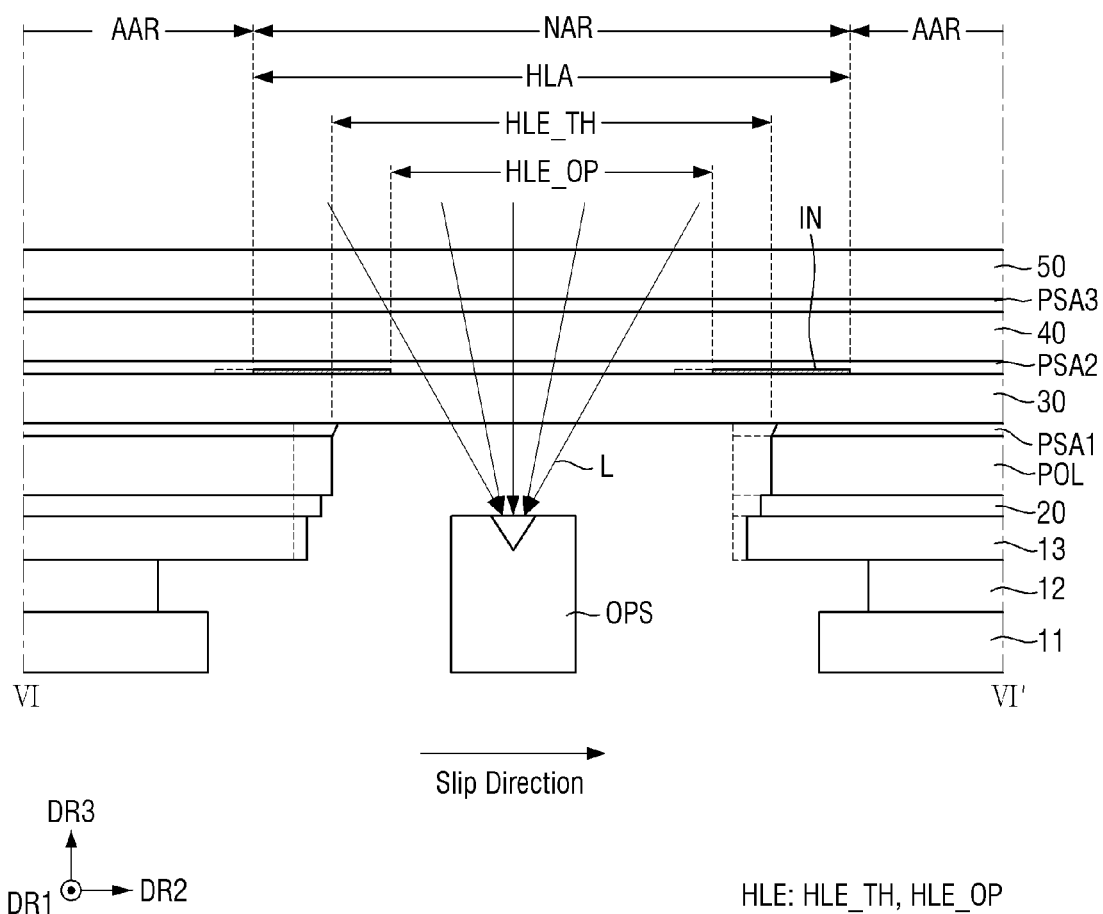
FIG. 8 illustrates a cross-sectional view showing the display device of FIG. 6 in a folded state.

FIG. 7 is a plan view showing a planar arrangement relationship between members around a hole area in a state where the display device of FIG. 5 is folded. FIG. 8 illustrates a cross-sectional view showing the display device of FIG. 6 in a folded state.

Referring further to FIGS. 7 and 8, when the display device 1 is folded, the inner wall of the through hole HLE_TH and the printed layer IN (or the optical hole HLE_OP) may be pushed out in a direction from the folding line FDA to the through hole HLE_TH with respect to the second direction DR2. The inner wall of the through hole HLE_TH may be pushed out toward the outside (one side in the second direction DR2) of the display device 1 in the second direction DR2. In this case, the inner wall of the through hole HLE_TH, which is disposed between the optical element OPS and the folding area FDA may move toward the optical element OPS. That is, in the plan view of FIG. 7, while the optical element OPS is fixed, the through hole HLE_TH and the optical hole HLE_OP may move (i.e., slip) toward one side in the second direction DR2.

However, when the second width W2 of the through hole HLE_TH is greater than the first width W1 of the through hole HLE_TH, the optical element OPS and the inner wall of the through hole HLE_TH may be spaced apart at a sufficient interval. Therefore, even if the inner wall of the through hole HLE_TH moves toward the optical element OPS as the display device 1 is folded, the optical element OPS and the inner wall of the through hole HLE_TH may not become in contact with each other, and thus defects such as interference due to contact can be effectively suppressed or prevented.

In addition, when the inner wall of the through hole HLE_TH is pushed out to the direction away from the folding line FDA, the degree of being pushed out may be different for each laminated member, and the inner wall of the through hole HLE_TH is inclined with respect to the thickness direction (i.e., third direction DR3). When the inner wall of the through hole HLE_TH is inclined, an optical shadow may be generated in the thickness direction (i.e., third direction DR3) by the reverse inclined portion. In the case of the display device 1 folded in the in-folding manner, in the plurality of laminated layers, in the thickness direction (i.e., third direction DR3), the upper layer may be further pushed out toward the outside of the display device 1 in comparison with the lower layer as shown in FIG. 8. As the display device 1 is folded, not only the inner wall of the through hole HLE_TH but also the printed layer IN may be pushed out in the direction from the folding line FDA to the through hole HLE_TH.

However, when the fourth width W4 of the optical hole HLE_OP is greater than the third width W3 of the optical hole HLE_OP, the optical hole HLE_OP and the optical element OPS may be spaced apart at a sufficient interval in a plan view. That is, even when the display device 1 is folded and the printed layer IN is pushed out to the one side (outside of the display device 1 in the second direction DR2) in the second direction DR2, the printed layer IN may not cover the optical element OPS. Accordingly, even when the display device 1 is folded, the optical element OPS can ensure a sufficient angle of view, and smoothly operate by receiving light from the outside through the optical hole HLE_OP.

In addition, in the through hole HLE_TH having the width W1 in one direction (i.e., first direction DR1) and the width W2 of the through hole HLE_TH in another direction (i.e., second direction DR2), when the width W2 in the direction (i.e., second direction DR2) substantially perpendicular to the extension direction (i.e., first direction DR1) of the folding area FDA is formed to be greater than the width W1, it is possible to minimize an increase in areas of the impact absorbing layer 30, the cover window 40 and the cover window protection layer 50, which overlap the through hole HLE_TH, while suppressing or preventing defects such as the interference due to the contact between the optical element OPS and the inner wall of the through hole HLE_TH, the optical shadow or the like, despite folding of the display device 1.

Therefore, even if the foldable display device 1 includes the through hole HLE_TH, an increase in the amount of change such as a change, in which the impact absorbing layer 30, the cover window 40, and the cover window protection layer 50 sag downward due to external impacts or pressures applied to the region overlapping the through hole HLE_TH, can be minimized. As a result, it is possible to suppress or prevent defects such as deformation of the impact absorbing layer 30, the cover window 40, and the cover window protection layer 50, or crack generated in the impact absorbing layer 30, the cover window 40, and the cover window protection layer 50, which are caused by the change.

Hereinafter, a cross-sectional structure of the display panel of the display device will be described in detail.

Figure 9:
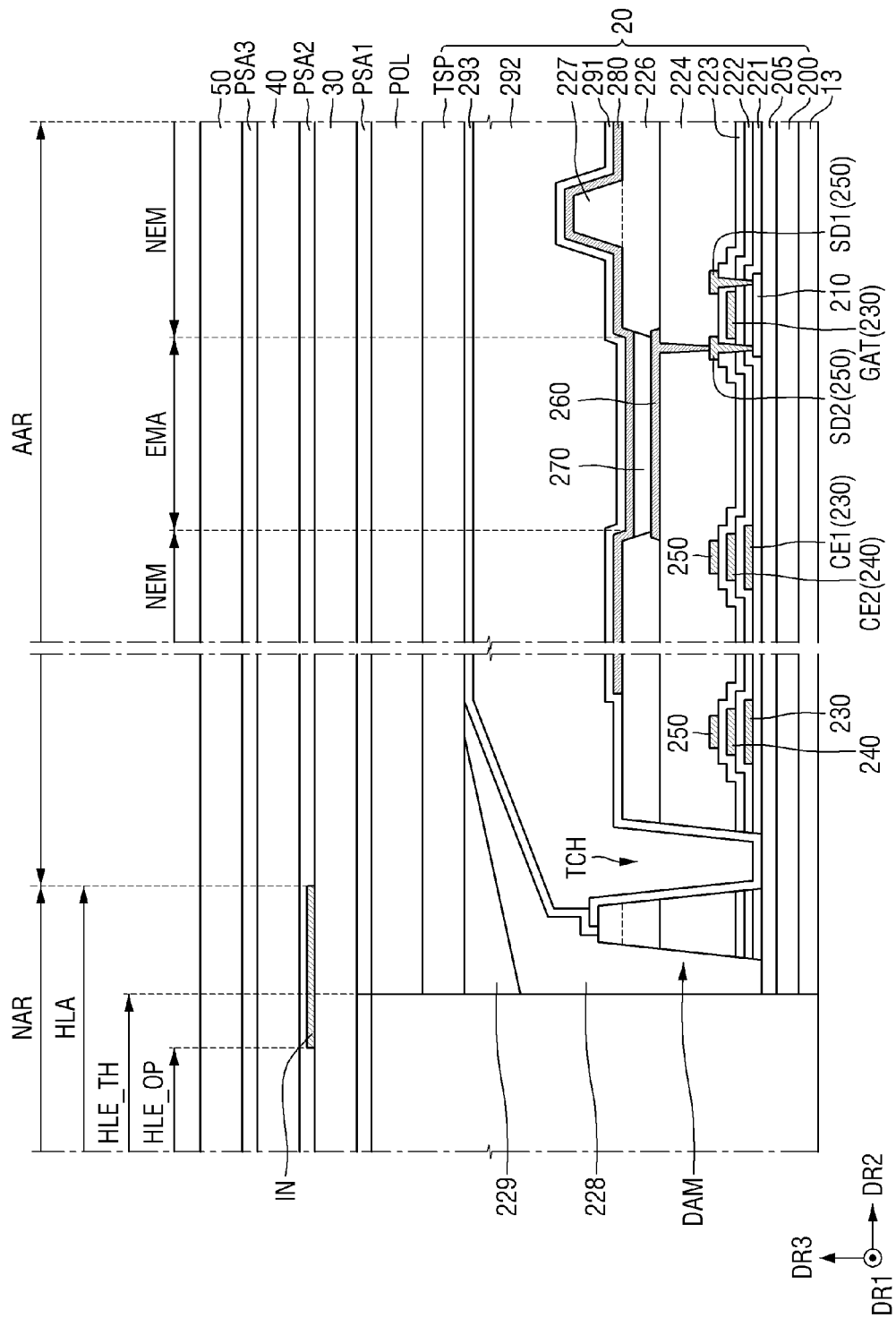
FIG. 9 is a cross-sectional view showing a periphery of a hole area and one pixel of a display device according to an embodiment.

FIG. 9 is a cross-sectional view showing a periphery of a hole area and one pixel of a display device according to an embodiment.

Referring to FIG. 9, the display panel 20 of the display device 1 may include a substrate 200, a buffer layer 205, a semiconductor layer 210, a first insulating layer 221, a first gate conductive layer 230, a second insulating layer 222, a second gate conductive layer 240, a third insulating layer 223, a data conductive layer 250, a fourth insulating layer 224, an anode electrode 260, a bank layer 226 including an opening to expose the anode electrode 260, a light emitting layer 270 disposed in the opening of the bank layer 226, a cathode electrode 280 disposed on the light emitting layer 270 and the bank layer 226, and a thin film encapsulation layer 290 disposed on the cathode electrode 280. Each of the layers described above may consist of a single layer, or a stack of multiple layers. Other layers may be further disposed between the layers.

The substrate 200 may support the respective layers disposed thereon. The substrate 200 may be made of an insulating material such as a polymer resin or an inorganic material such as glass or quartz. The substrate 200 may be a flexible substrate, and may be bent, rolled, or folded, but the invention is not limited thereto.

The buffer layer 205 is disposed on the substrate 200. The buffer layer 205 may include silicon nitride, silicon oxide, or silicon oxynitride.

The semiconductor layer 210 is disposed on the buffer layer 205. The semiconductor layer 210 forms a channel of a thin film transistor of the pixel PX.

The first insulating layer 221 is disposed on the semiconductor layer 210. The first insulating layer 221 may be a gate insulating layer having a gate insulating function.

The first gate conductive layer 230 is disposed on the first insulating layer 221. The first gate conductive layer 230 may include a gate electrode GAT of the thin film transistor of the pixel PX, a scan line connected thereto, and a first electrode CE1 of a storage capacitor.

The second insulating layer 222 may be disposed on the first gate conductive layer 230. The second insulating layer 222 may be an interlayer insulating layer or a second gate insulating layer.

The second gate conductive layer 240 is disposed on the second insulating layer 222. The second gate conductive layer 240 may include a second electrode CE2 of the storage capacitor.

The third insulating layer 223 is disposed on the second gate conductive layer 240. The third insulating layer 223 may be an interlayer insulating layer.

The data conductive layer 250 is disposed on the third insulating layer 223. The data conductive layer 250 may include a first electrode SD1 and a second electrode SD2 of the thin film transistor of the pixel PX. The first electrode SD1 and the second electrode SD2 of the thin film transistor may be electrically connected to a source region and a drain region of the semiconductor layer 210 via contact holes passing through the third insulating layer 223, the second insulating layer 222 and the first insulating layer 221.

The fourth insulating layer 224 is disposed on the data conductive layer 250. The fourth insulating layer 224 covers the data conductive layer 250. The fourth insulating layer 224 may be a via layer.

The anode electrode 260 is disposed on the fourth insulating layer 224. The anode electrode 260 may be a pixel electrode provided for each pixel PX. The anode electrode 260 may be connected to the second electrode SD2 of the thin film transistor via the contact hole passing through the fourth insulating layer 224. The anode electrode 260 may at least partially overlap an emission region EMA of the pixel PX.

The anode electrode 260 may have a stacked structure formed by stacking a material layer having a high work function, such as indium tin oxide ("ITO"), indium zinc oxide ("IZO"), zinc oxide ("ZnO") and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but the invention is not limited thereto. The layer having a high work function may be disposed above the reflective material layer and disposed closer to the light emitting layer 270. The anode electrode 260 may have a multilayer structure such as ITO/Mg, ITO/MgF, ITO/Ag and ITO/Ag/ITO, but the invention is not limited thereto.

The bank layer 226 may be disposed on the anode electrode 260. The bank layer 226 may be disposed on the anode electrode 260 and may define an opening exposing the anode electrode 260. The emission region EMA and the non-emission region NEM may be distinguished by the bank layer 226 and the opening defined by the bank layer 226.

A spacer 227 may be disposed on the bank layer 226. The spacer 227 may serve to maintain a gap with a structure disposed thereabove.

The light emitting layer 270 is disposed on the anode electrode 260 exposed by the bank layer 226. The light emitting layer 270 may include an organic material layer. The organic material layer of the light emitting layer may include an organic light emitting layer, and may further include a hole injecting/transporting layer and/or an electron injecting/transporting layer.

The cathode electrode 280 may be disposed on the light emitting layer 270. The cathode electrode 280 may be a common electrode extended across all the pixels PX. Each of the anode electrode 260, the light emitting layer 270 and the cathode electrode 280 may constitute an organic light emitting element.

The cathode electrode 280 may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The cathode electrode 280 may further include a transparent metal oxide layer disposed on the material layer having a low work function.

The thin film encapsulation layer 290 including a first inorganic film 291, a first organic film 292 and a second inorganic film 293 is disposed on the cathode electrode 280. The first inorganic film 291 and the second inorganic film 293 may be in contact with each other at an end portion of the thin film encapsulation layer 290. The first organic film 292 may be sealed by the first inorganic film 291 and the second inorganic film 293.

Each of the first inorganic film 291 and the second inorganic film 293 may include silicon nitride, silicon oxide, silicon oxynitride, or the like. The first organic film 292 may include an organic insulating material.

The display panel 20 may further include a touch layer TSP disposed on the thin film encapsulation layer 290. The touch layer TSP may sense a touch input. The touch layer TSP may be provided as a separate panel or film from the display panel 20 and may be attached onto the display panel 20, but may be provided in the form of the touch layer TSP inside the display panel 20, as illustrated.

The anti-reflection member POL may be disposed on the touch layer TSP. The impact absorbing layer 30 may be disposed on the anti-reflection member POL, and the cover window 40 and the cover window protection layer 50 may be disposed on the impact absorbing layer 30. Since the anti-reflection member POL, the cover window 40, and the cover window protection layer 50 have been described above, redundant descriptions thereof will be omitted.

A dam structure DAM may be disposed around the through hole HLE_TH. The dam structure DAM may include stacked insulating layers 205, 221, 222, 223, 224, 226 and 227. Between the dam structure DAM and the pixel PX, a groove TCH from which the insulating layers 205, 221, 222, 223, 224 and 226 and the metal layers 230, 240, 250, 260 and 280 are removed may be disposed except for the substrate 200. At least a part of the thin film encapsulation layer 290 may be disposed in the groove TCH. For example, the first organic film 292 of the thin film encapsulation layer 290 may be disposed on the dam structure DAM, but may not be disposed on the hole area HLA beyond the dam structure DAM. That is, the first organic film 292 can be effectively prevented from overflowing into the hole area HLA through the dam structure DAM. The first inorganic film 291 or the second inorganic film 293 of the thin film encapsulation layer 290 may be further disposed beyond the dam structure DAM. Although it is illustrated that the first inorganic film 291 and the second inorganic film 293 terminate on the dam structure DAM before the through hole HLE_TH without being opened at the through hole HLE_TH, the present disclosure according to the invention is not limited thereto.

Figure 10:
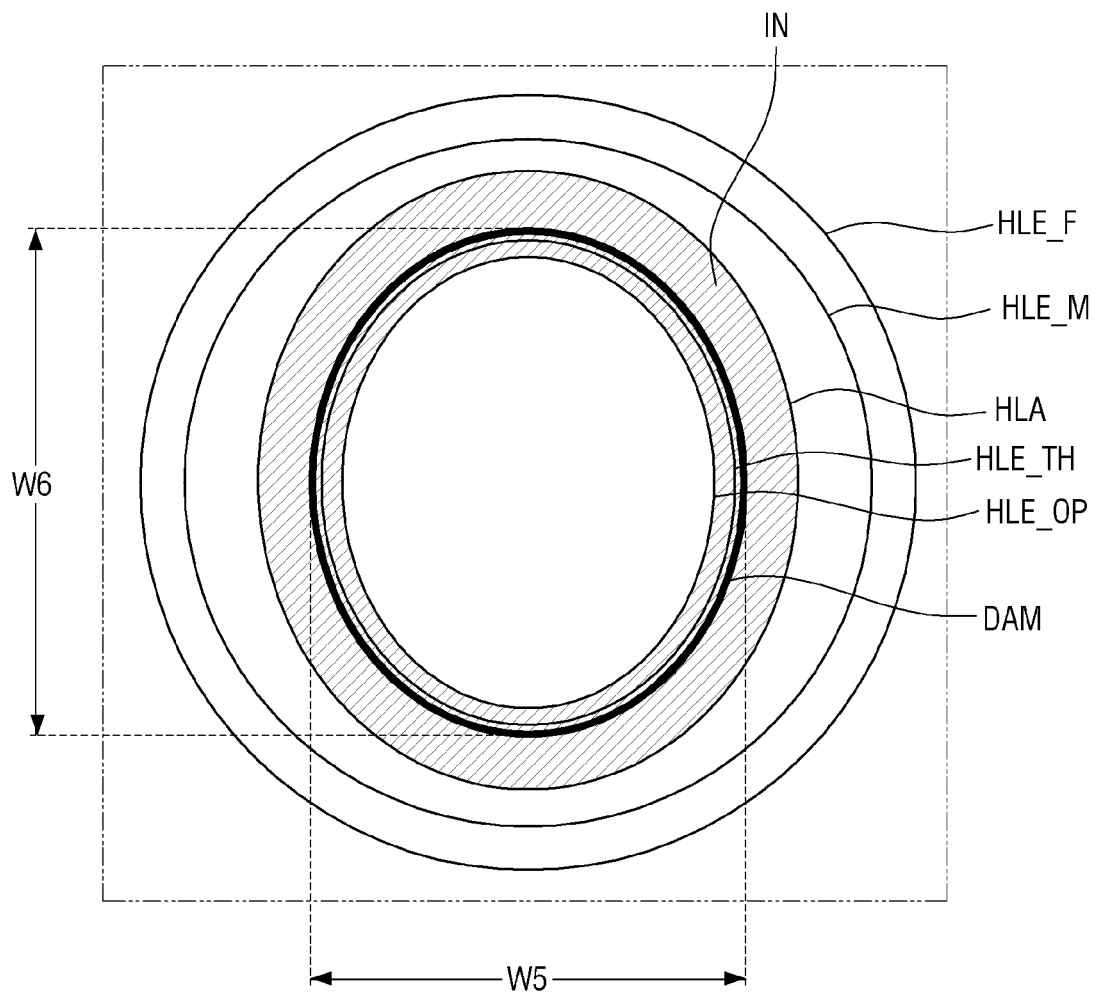
FIG. 10 is a plan view showing a planar arrangement relationship between members around a hole area.

The planar shape of the dam structure DAM may correspond to the planar shape of the through hole HLE_TH, but the invention is not limited thereto. Reference is further made to FIG. 10 to describe the planar shape of the dam structure DAM.

FIG. 10 is a plan view showing a planar arrangement relationship between members around a hole area. FIG. 10 is substantially the same as FIG. 5, but further includes the planar shape of the dam structure DAM.

Referring further to FIG. 10, the dam structure DAM surrounds the through hole HLE_TH and the optical hole HLE_OP in a plan view. The planar shape of the dam structure DAM may correspond to the planar shape of any one of the through hole HLE_TH and the optical hole HLE_OP. The dam structure DAM may have an elliptical shape in a plan view, but the invention is not limited thereto.

The dam structure DAM may include a fifth width W5 and a sixth width W6. The fifth width W5 (in other words, fifth maximum width) of the dam structure DAM refers to the greatest width of the dam structure DAM in the first direction DR1, and the sixth width W6 (in other words, sixth maximum width) of the dam structure DAM refers to the greatest width of the dam structure DAM in the second direction DR2. That is, the fifth width W5 of the dam structure DAM refers to a width in a direction substantially the same as the direction (i.e., first direction DR1) in which the folding area FDA extends, and the sixth width W6 of the dam structure DAM refers to a width in a direction substantially perpendicular to the direction (i.e., first direction DR1) in which the folding area FDA extends.

The fifth width W5 and the sixth width W6 of the dam structure DAM may have different lengths. The sixth width W6 of the dam structure DAM may be greater than the fifth width W5 of the dam structure DAM. That is, in the dam structure DAM having the fifth width W5 and the sixth width W6, the width (i.e., sixth width W6) in the direction substantially perpendicular to the direction (i.e., first direction DR1) in which the folding area FDA extends may be greater than the width (i.e., fifth width W5) in the direction substantially the same as the direction (i.e., first direction DR1) in which the folding area FDA extends. That is, the dam structure DAM may have, for example, an elliptical shape in a plan view, in which the width (i.e., sixth width W6) in the second direction DR2 is greater than the width (i.e., fifth width W5) in the first direction DR1.

Referring to FIG. 9 again, the hole area HLA may overlap the dam structure DAM in the thickness direction (i.e., third direction DR3) of the display device 1 without overlapping the pixel PX. Accordingly, video and images may not be displayed on the hole area HLA. However, the present disclosure according to the invention is not limited thereto. Even if it partially overlaps the pixel PX, light emitted from the pixel PX is blocked by the printed layer IN such that video and images cannot be displayed externally, and thus, it may be the non-active region NAR.

The thin film encapsulation layer 290 may be inclined downward toward the through hole HLE_TH in the vicinity of the through hole HLE_TH. At least one organic film 228, 229 may be further disposed on the thin film encapsulation layer 290 to planarize the inclined surface around the through hole HLE_TH. For example, the second organic film 228 may be disposed on the first organic film 292, and the third organic film 229 may be disposed on the second organic film 228. The second organic film 228 and the third organic film 229 may function to fill an inclined portion around the through hole HLE_TH for planarization. In one embodiment, the second organic film 228 and the third organic film 229 may be exposed on the side of the through hole HLE_TH to form the inner wall of the through hole HLE_TH. Accordingly, the inner wall of the through hole HLE_TH may be formed with the respective side surfaces of the substrate 200, the buffer layer 205, the second organic film 228, the third organic film 229, the touch layer TSP, the anti-reflection member POL, and the impact absorbing layer 30.

The above-mentioned side surfaces may be aligned in the thickness direction (i.e., third direction) to form the inner wall of the through hole HLE_TH. In cross-sectional view, the through hole HLE_TH may include inner walls on one side and on another side in the second direction DR2. Although only the inner wall of the through hole HLE_TH located on one side in the second direction DR2 is shown in FIG. 9, the remaining inner wall of the through hole HLE_TH may be located on another side in the second direction DR2 of the figure and the structure of the display panel 20 and the stacked structure shown in FIG. 9 may exist symmetrically.

Hereinafter, other embodiments of the display device will be described. In the following embodiment, a description of the same components as those of the above-described embodiment will be omitted or simplified, and differences will be mainly described.

Figure 11:
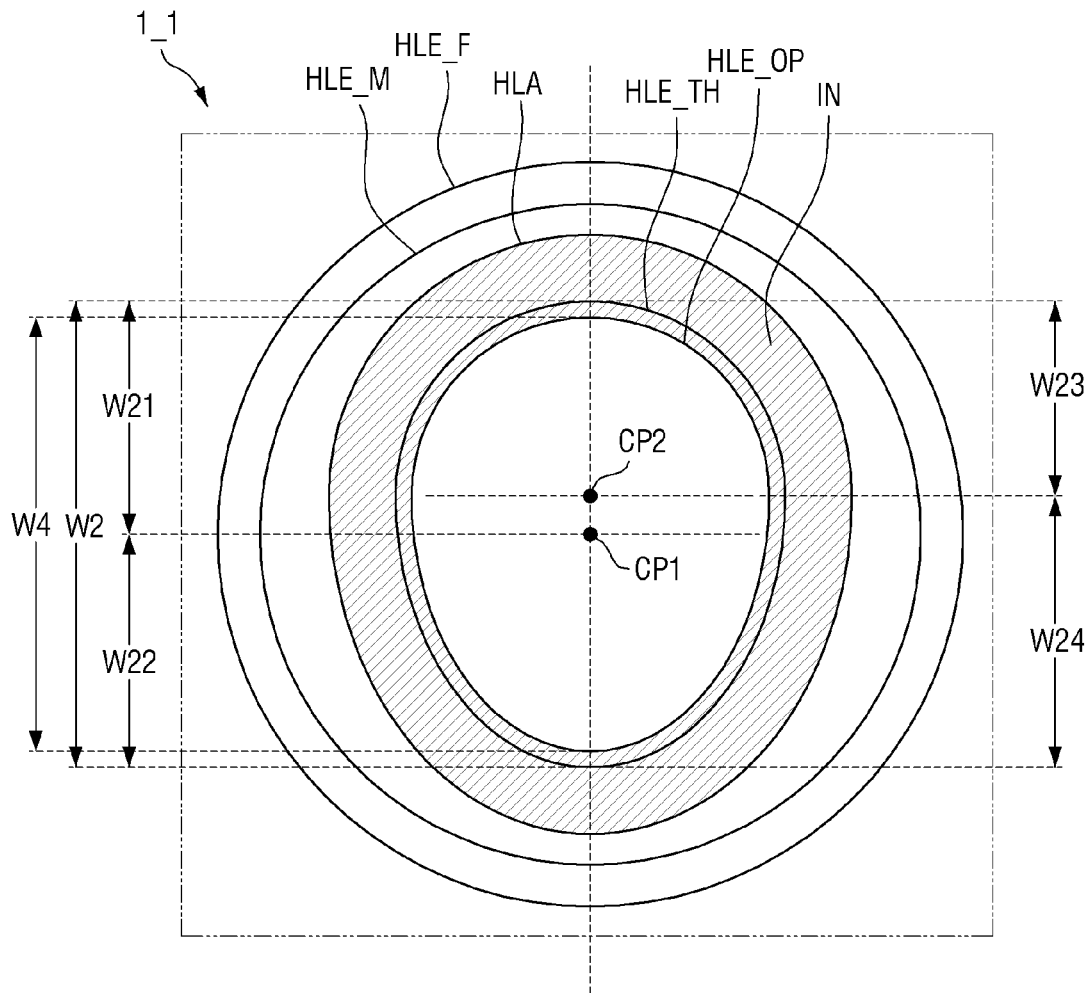
FIG. 11 is a plan view showing a planar arrangement relationship between members around a hole area of a display device according to another embodiment.

FIG. 11 is a plan view showing a planar arrangement relationship between members around a hole area of a display device according to another embodiment.

Referring to FIG. 11, the through hole HLE_TH of a display device 1_1 according to the present embodiment is different from the embodiment of FIG. 5 in that areas on one side and another side in the second direction DR2 are asymmetric with respect to a center point CP_1 (including CP1 and CP2).

Specifically, the center point CP_1 may be disposed inside the through hole HLE_TH of the display device 1_1 according to the present embodiment. The center point CP_1 may include a first center point CP1 and a second center point CP2.

The first center point CP1 may be arranged on one side of the second center point CP2 in the second direction DR2 and may be located closer to the folding area FDA (see FIG. 1) than the second center point CP2. The first center point CP1 is located at a point that bisects the second width W2 of the through hole HLE_TH. That is, a first part W21 and a second part W22 of the second width W2 which is bisected by the first center point CP1 may have the same size.

Two regions of the through hole HLE_TH, which is bisected by an imaginary line extending in the first direction DR1 from the first center point CP1 in a plan view, may have different planar areas from each other. With regard to the two areas, the area of the region that has the first part W21 of the second width W2 may be greater than the area of the region that has the second part W22 of the second width W2. That is, with regard to the planar areas of the two regions of the through hole HLE_TH, which is bisected by the imaginary line extending from the first center point CP1 in the first direction DR1, the planar area of the region located closer to the folding area FDA (see FIG. 1) may be smaller.

The second center point CP2 is located at a point that bisects the second width W2 of the through hole HLE_TH. A third part W23 and a fourth part W24 of the second width W2 bisected by the second center point CP2 may have different sizes. The third part W23 of the second width W2 may be smaller in size than the fourth part W24 of the second width W2.

Two regions of the through hole HLE_TH, which is bisected by an imaginary line extending in the first direction DR1 from the second center point CP2 in a plan view, may have different planar areas. With regard to the two areas, the area of the region that has the third part W23 of the second width W2 may be smaller than the area of the region that has the fourth part W24 of the second width W2. That is, with regard to the planar areas of the two regions of the through hole HLE_TH, which is bisected by the imaginary line extending in the first direction DR1 from the second center point CP2, the planar area of the region located closer to the folding area FDA (see FIG. 1) may be greater.

As to the two regions of the through hole HLE_TH, which is bisected by the imaginary line extending in the first direction DR1 from the second center point CP2, the planar shape of the region (i.e., lower part in FIG. 11) located closer to the folding area FDA (see FIG. 1) may have a part of an elliptical shape and the planar shape of the other region (i.e., upper part in FIG. 11) farther to the folding area FDA may have a part of a circular shape, but the invention is not limited thereto. In this case, in the rim of the through hole HLE_TH in a plan view, at two end points on opposite sides in the first direction DR1 with respect to the second center point CP2, tangent lines may be drawn to extend in a direction substantially the same as the second direction DR2.

The two regions of the through hole HLE_TH, which is bisected by the imaginary line extending in the first direction DR1 from the first center point CP1 or the second center point CP2 in a plan view, may not be symmetrical to each other.

Even in this case, in the through hole HLE_TH, the width in the direction perpendicular to the direction in which the folding area FDA (see FIG. 1) extends is greater than the width in the same direction as the direction in which the folding area FDA (see FIG. 1) extends. Accordingly, it is possible to minimize deformation of the impact absorbing layer 30 (see FIG. 6), the cover window 40 (see FIG. 6), and the cover window protection layer 50 (see FIG. 6) that cover the through hole HLE_TH, while preventing or suppressing defects due to interference between the optical element OPS (see FIG. 6) and the inner wall of the through hole HLE_TH, or the optical shadow.

Figure 12:
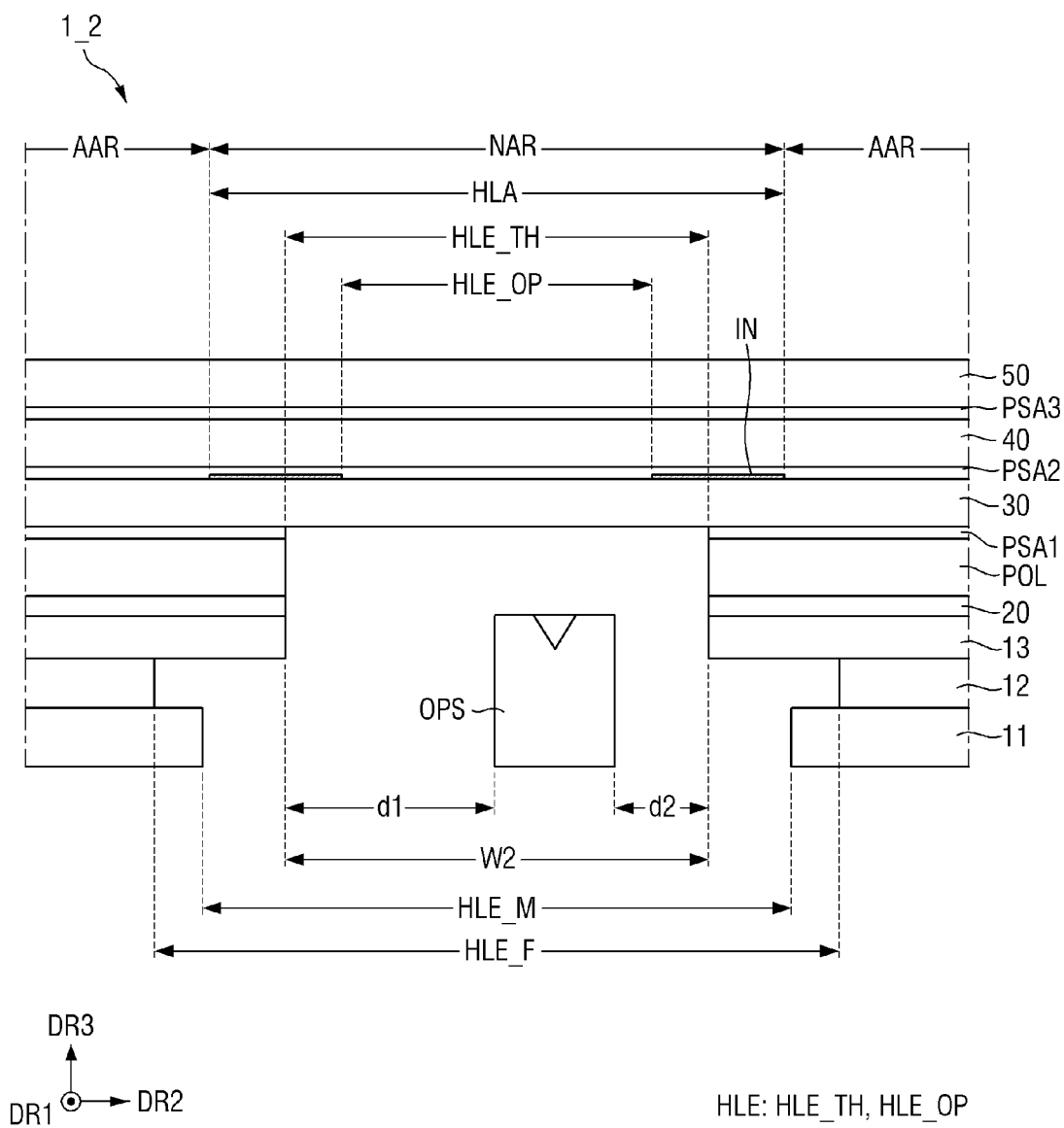
FIG. 12 is a cross-sectional view of a portion around a hole area of a display device according to still another embodiment.
Figure 13:
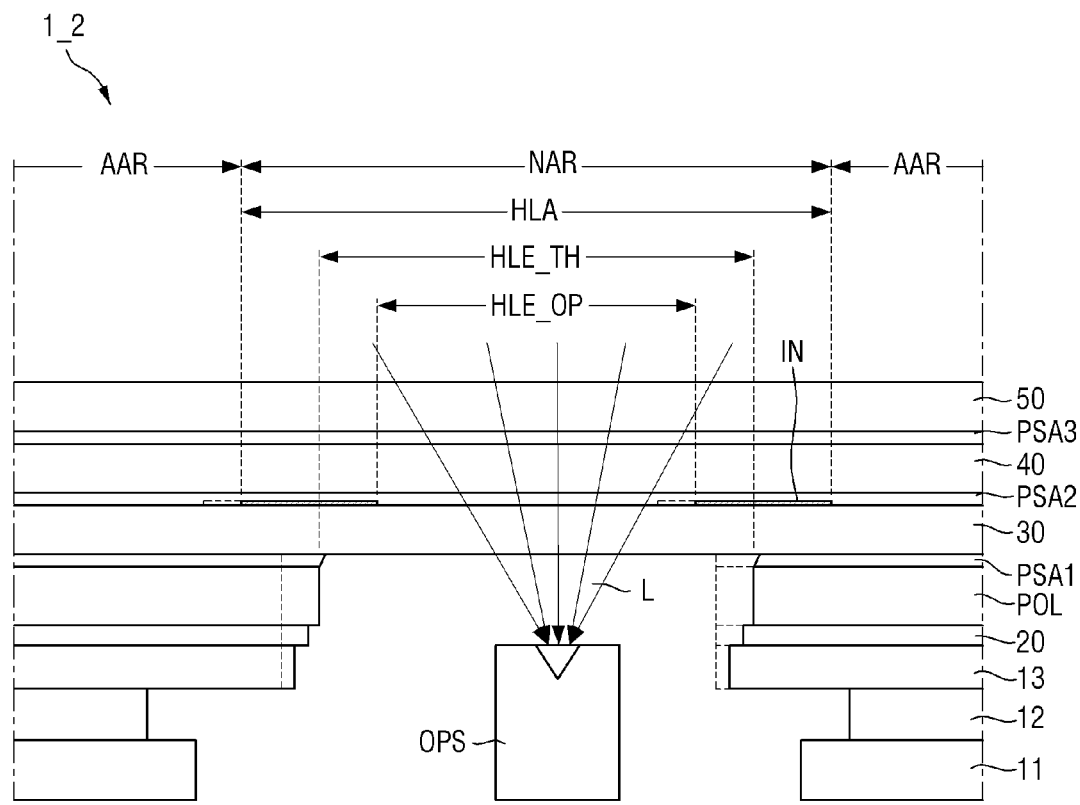
FIG. 13 is a cross-sectional view showing the display device of FIG. 12 in a folded state.

FIG. 12 is a cross-sectional view of a portion around a hole area of a display device according to still another embodiment. FIG. 13 is a cross-sectional view showing the display device of FIG. 12 in a folded state.

Referring to FIGS. 12 and 13, it is different from the embodiment of FIG. 6 in that the optical element OPS of a display device 1_2 according to the present embodiment may be provided in a position biased to an opposite side to the folding line FDA (see FIG. 6) inside the through hole HLE_TH.

Specifically, the optical element OPS may be in the position biased toward the outside of the display device 1_2 in the second direction DR2, in the hole area HLA. That is, the optical element OPS may be in the position biased toward one side of the through hole HLE_TH in the second direction DR2. The interval between the optical element OPS and the inner wall of the through hole HLE_TH in the second direction DR2 may include a first interval d1 and a second interval d2. The first interval d1 may be closer to the folding area FDA (see FIG. 1) than the second interval d2. The first interval d1 may be greater than the second interval d2.

Accordingly, when the display device 1_2 is folded, even if each of the components positioned between the optical element OPS and the folding area FDA (see FIG. 1) is pushed out toward the optical element OPS, a sufficient interval (first interval d1) may be ensured between each of the components and the optical element OPS. Accordingly, the optical element OPS and the inner wall of the through hole HLE_TH may not become in contact with each other, and defects such as interference due to contact or the like can be effectively suppressed or prevented.

Even in this case, in the through hole HLE_TH, the width in the direction perpendicular to the direction in which the folding area FDA (see FIG. 1) extends is greater than the width in the same direction as the direction in which the folding area FDA (see FIG. 1) extends. Accordingly, it is possible to minimize deformation of the impact absorbing layer 30, the cover window 40, and the cover window protection layer 50 that cover the through hole HLE_TH, while preventing or suppressing defects due to the interference between the optical element OPS and the inner wall of the through hole HLE_TH, or the optical shadow.

Figure 14:
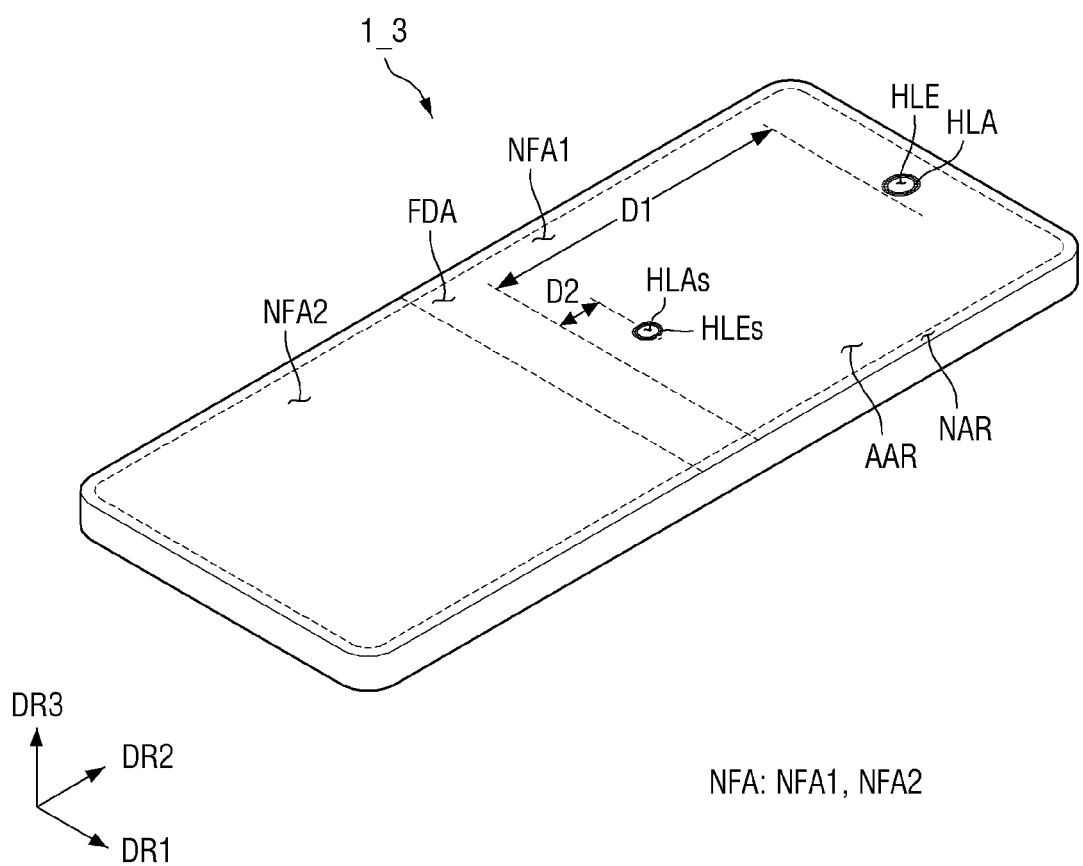
FIG. 14 is a perspective view of a display device according to still another embodiment.
Figure 15:
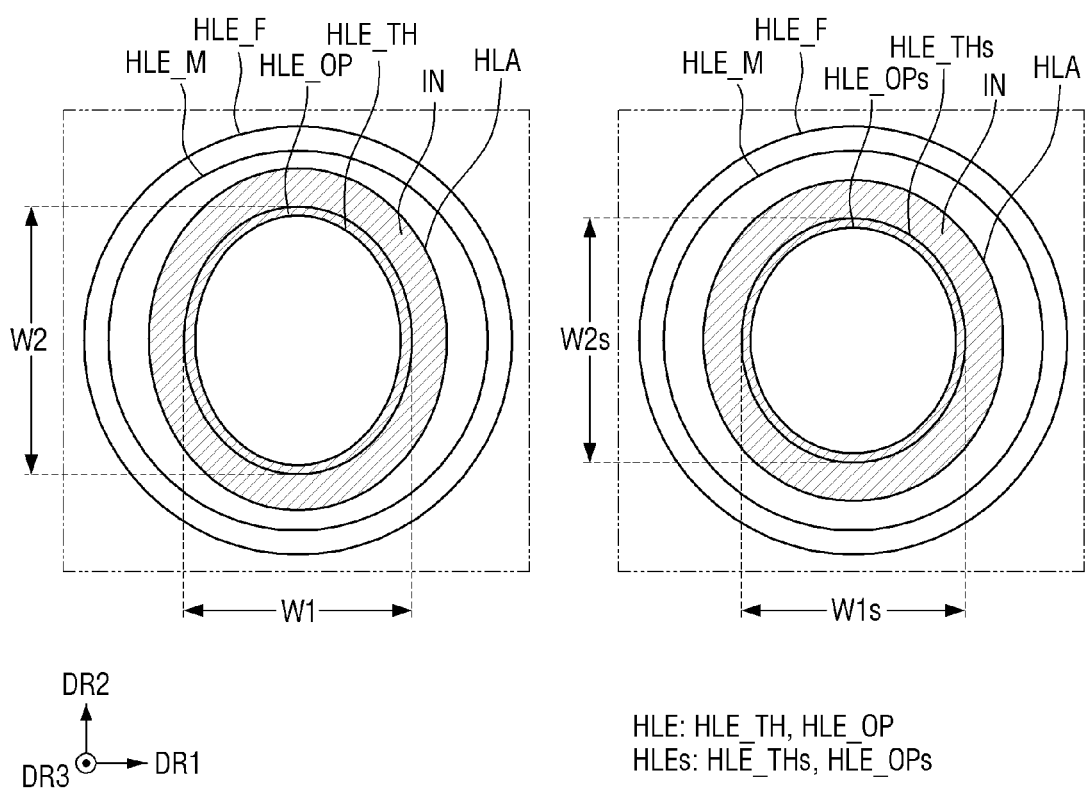
FIG. 15 is a plan view showing a planar arrangement relationship between members around a hole area and a sub-hole area according to another embodiment.

FIG. 14 is a perspective view of a display device according to still another embodiment. FIG. 15 is a plan view showing a planar arrangement relationship between members around a hole area and a sub-hole area according to another embodiment. FIG. 14 illustrates an unfolded state of a display device 1_3 according to still another embodiment.

Referring to FIGS. 14 and 15, it is different from the embodiment of FIGS. 1 and 5 in that widths W2 and W2s in the second direction DR2 of respective through holes HLE_TH and HLE_THs of the display device 1_3 according to the present embodiment may vary depending on distances D1 and D2 to the folding area FDA.

Specifically, the display device 1_3 according to the present embodiment may include a hole area HLA and a hole HLE that are substantially the same as the hole area HLA and the hole HLE according to the above-described embodiment. The display device 1_3 may further include a sub-hole area HLAs and a sub-hole HLEs that are spaced apart from the hole area HLA and the hole HLE, and are positioned closer to the folding area FDA than the hole area HLA and the hole HLE. The hole area HLA and the hole HLE may be spaced apart from the folding area FDA by the first distance D1, and the sub-hole area HLAs and the sub-hole HLEs are spaced apart from the folding area FDA by the second distance D2. The first distance D1 may be greater than the second distance D2.

The first distance D1 and the second distance D2 may be derived by measuring a distance (i.e., first distance D1) between the folding area FDA and the hole HLE, and a distance (i.e., second distance D2) between the folding area FDA and the sub-hole HLEs, in the direction (i.e., second direction DR2) substantially perpendicular to the direction (i.e., the first direction DR1) in which the folding line FDA extends. The first distance D1 and the second distance D2 may be derived by measuring a minimum distance (i.e., first distance D1) between the folding area FDA and the through hole HLE_TH of the hole HLE and a minimum distance (i.e., second distance D2) between the sub-through hole HLE_THs of the sub-hole HLEs and the folding area FDA, but the invention is not limited thereto.

The sub-hole area HLAs and the sub-hole HLEs, which are disposed closer to the folding area FDA than the hole area HLA and the hole HLE, may have lengths smaller than the lengths of the hole area HLA and the hole HLE, in the second direction DR2. In addition, a ratio of the length in the second direction DR2 to the length in the first direction DR1 may be smaller.

In other words, the sub-hole HLEs may further include the physical sub-through hole HLE_THs and a sub-optical hole HLE_OPs that is an optical light transmitting window. The sub-through hole HLE_THs may include a first width W1s in the first direction DR1 and a second width W2s in the second direction DR2. The second width W2s may be greater than the first width W1s.

The second width W2s of the sub-through hole HLE_THs in the second direction DR2 may be smaller than the second width W2 of the through hole HLE_TH in the second direction DR2, in a plan view. The first width W1s of the sub-through hole HLE_THs in the first direction DR1 may be substantially the same as the first width W1 of the through hole HLE_TH in the first direction DR1, in a plan view.

Further, a ratio between the first width W1s and the second width W2s of the sub-through hole HLE_THs may be smaller than a ratio between the first width W1 and the second width W2 of the through hole HLE_TH. The second width W2s of the sub-through hole HLE_THs may be in a range of 1.01 to 1.1 times the first width W1s of the sub-through hole HLE_THs, but the invention is not limited thereto.

Although not shown, a sub-optical element may be further arranged in a region overlapping the sub-through hole HLE_THs.

As it gets closer to the folding area FDA, the amount of slip according to folding of the display device 1_3 may decrease. Accordingly, the second width W2s of the sub-through hole HLE_THs located closer to the folding area FDA may be smaller than the second width W2 of the through hole HLE_TH located farther from the folding area FDA. Therefore, the second width W2s of the sub-through hole HLE_THs may be greater than the first width W1s of the sub-through hole HLE_THs and smaller than the second width W2 of the through hole HLE_TH.

Consequently, it is possible to suppress or prevent defects due to interference with the sub-optical element (not shown) that is disposed in the region overlapping the sub-through hole HLE_THs, the optical shadow or the like. In addition, since areas, in which the impact absorbing layer 30, the cover window 40, and the cover window protection layer 50 covering the sub-through hole HLE_THs overlap the sub-through hole HLE_THs, may be smaller, it is possible to more smoothly suppress or prevent defects such as cracks that may occur due to external pressures or impacts.

The sub-through hole HLE_THs of the sub-hole HLEs has been described above, but the above description may also be applied to the sub-optical hole HLE_OPs of the sub-hole HLEs. Further, for convenience of description, the description has been made in conjunction with the two hole areas HLA and HLAs and the two holes HLE and HLEs, but the invention is not limited thereto, and three or more hole areas and holes may be included. In this case, the width of the through hole of each hole in the second direction DR2 may increase as the distance between the folding area FDA and the through hole of each hole in the second direction DR2 increases.

Figure 16:
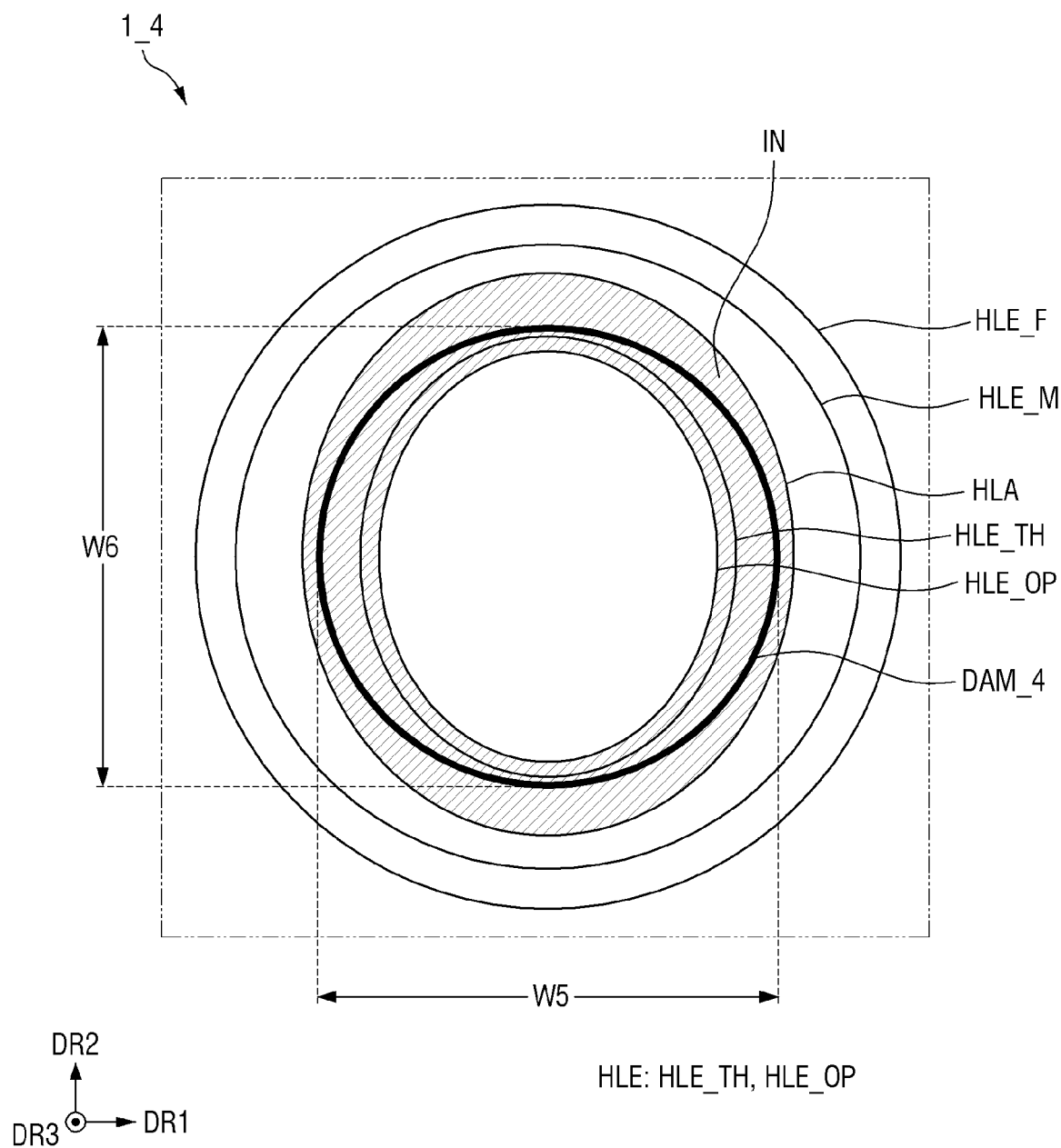
FIG. 16 is a plan view showing a planar arrangement relationship between members around a hole area of a display device according to still another embodiment.

FIG. 16 is a plan view showing a planar arrangement relationship between members around a hole area of a display device according to still another embodiment. FIG. 16 is substantially the same as FIG. 5, but further includes a planar shape of a dam structure DAM_4.

Referring to FIG. 16, it is different from the embodiment of FIG. 10 in that the planar shape of the dam structure DAM_4 of a display device 1_4 according to the present embodiment does not correspond to the planar shapes of the through hole HLE_TH and the optical hole HLE_OP.

Specifically, the dam structure DAM_4 according to the present embodiment may have a circular shape in a plan view. For example, although each of the through hole HLE_TH and the optical hole HLE_OP has a planar shape in which a width in the first direction DR1 is different from a width in the second direction DR2, the dam structure DAM_4 according to the present embodiment may have a circular shape in which a width in the first direction DR1 is the same as a width in the second direction DR2, but the invention is not limited thereto.

Even in this case, in the through hole HLE_TH, the width in the direction perpendicular to the direction in which the folding area FDA (see FIG. 1) extends is greater than the width in the same direction as the direction in which the folding area FDA (see FIG. 1) extends. Accordingly, it is possible to minimize deformation of the impact absorbing layer 30, the cover window 40, and the cover window protection layer 50 that cover the through hole HLE_TH, while preventing or suppressing defects due to the interference between the optical element OPS and the inner wall of the through hole HLE_TH, or the optical shadow.

Figure 17:
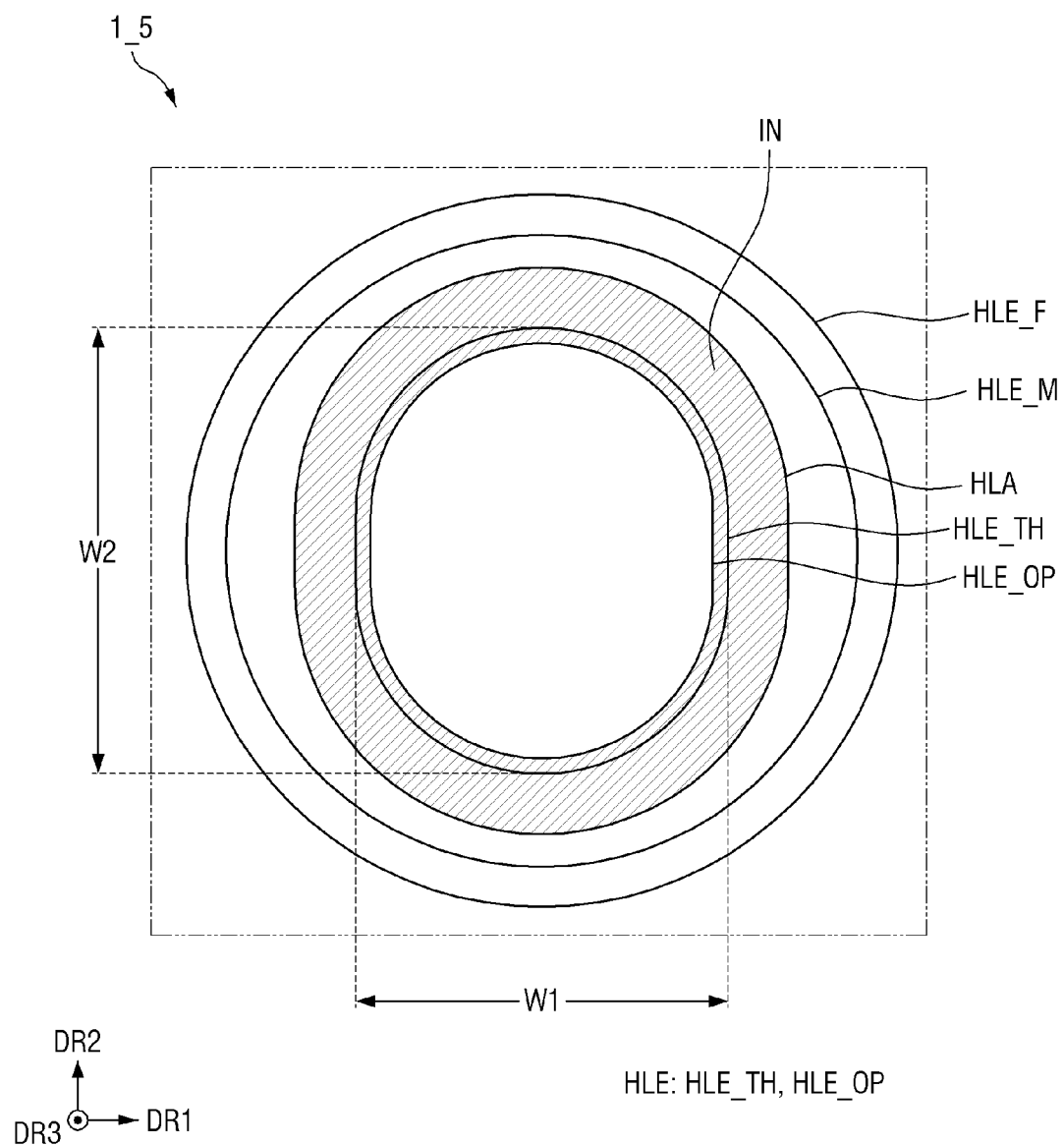
FIG. 17 is a plan view showing a planar arrangement relationship between members around a hole area of a display device according to still another embodiment.

FIG. 17 is a plan view showing a planar arrangement relationship between members around a hole area of a display device according to still another embodiment.

Referring to FIG. 17, it is different from the embodiment of FIG. 5 in that the planar shape of the through hole HLE_TH of a display device 1_5 according to the present embodiment may not be an elliptical shape.

Specifically, the through hole HLE_TH of the display device 1_5 according to the present embodiment may have the first width W1 in the first direction DR1 and the second width W2 in the second direction DR2 that is greater than the first width W1, but may not have an elliptical shape in a plan view. Although not limited to the following, for example, the through hole HLE_TH of the display device 1_5 may include two semicircular shapes spaced apart from each other, and straight lines that are arranged between the two semicircular shapes and extend in the second direction DR2 to connect the two semicircular shapes with each other. That is, the through hole HLE_TH of the display device 1_5 may include the two straight lines extending in the second direction DR2 in a plan view, and the semicircular shapes respectively arranged on one side and another side of the straight lines in the second direction DR2.

Even in this case, in the through hole HLE_TH of the display device 1_5, the width in the direction perpendicular to the direction in which the folding area FDA (see FIG. 1) extends is greater than the width in the same direction as the direction in which the folding area FDA (see FIG. 1) extends. Accordingly, it is possible to minimize deformation of the impact absorbing layer 30, the cover window 40, and the cover window protection layer 50 that cover the through hole HLE_TH, while preventing or suppressing defects due to the interference between the optical element OPS and the inner wall of the through hole HLE_TH, or the optical shadow.

In concluding the detailed description, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed is:

1. A foldable display device including a display panel, the display device comprising:
    a folding line extending in a first direction;
    a first non-folding area disposed on a first side of the folding line and which extends in a second direction perpendicular to the first direction;
    a second non-folding area disposed on a second side of the folding line opposite the first side and which extends in the second direction; and
    a through hole defined in the first non-folding area and which penetrates the display panel in a thickness direction,
    wherein in a plan view, a first maximum width of the through hole in the first direction is smaller than a second maximum width of the through hole in the second direction,
    wherein the second maximum width of the through hole is in a range of about 1.05 to about 1.2 times the first maximum width.

2. The display device of claim 1, wherein the second maximum width of the through hole is in a range of about 3 to about 4 millimeters (mm), and the first maximum width of the through hole is in a range of about 2.7 to about 3.8 mm.

3. The display device of claim 2, wherein the through hole has an elliptical shape in the plan view.

4. The display device of claim 1, further comprising an optical element disposed to overlap an inside of the through hole in the plan view and including a light receiving portion.

5. The display device of claim 4, wherein the through hole includes a first inner wall and a second inner wall facing each other,
    the first inner wall is disposed closer to the folding line than the second inner wall, and
    a first interval between the optical element and the first inner wall is greater than a second interval between the optical element and the second inner wall.

6. The display device of claim 5, wherein the display device is in-folded with respect to the folding line.

7. The display device of claim 1, further comprising an anti-reflection member disposed on a first surface of the display panel,
    wherein the through hole further penetrates the anti-reflection member in the thickness direction.

8. The display device of claim 7, further comprising a polymer film layer disposed on a second surface of the display panel opposite the first surface,
    wherein the through hole further penetrates the polymer film layer in the thickness direction.

9. The display device of claim 8, wherein in a folded state, an inner wall of the through hole is inclined with respect to the thickness direction.

10. The display device of claim 7, further comprising:
    a cover window disposed above the display panel, and covering the through hole in the plan view; and
    a cover window protection layer disposed on the cover window.

11. The display device of claim 1, further comprising a heat dissipation member disposed below the display panel, and including a lower through hole which penetrates the heat dissipation member in the thickness direction,
    wherein the lower through hole overlaps the through hole in the plan view.

12. The display device of claim 11, wherein in the plan view, the lower through hole surrounds the through hole, and has a circular shape.

13. A display device including a folding line extending in a first direction and a hole area disposed on a first side of the folding line, the display device comprising:
    a display panel;
    a cover window disposed on the display panel; and
    a printed layer disposed on the cover window,
    wherein the hole area includes:
        a through hole which penetrates the display panel in a thickness direction; and
        an optical hole defined by the printed layer, the optical hole overlapping the through hole in a plan view, and
    wherein in the plan view, a first maximum width of the optical hole in the first direction is smaller than a second maximum width of the optical hole in a second direction perpendicular to the first direction,
    wherein in the plan view a fourth maximum width of the through hole in the second direction is in a range of about 1.05 to about 1.2 times a third maximum width or the through hole in the first direction.

14. The display device of claim 13, further comprising an optical element disposed to overlap the optical hole in the plan view, and including a light receiving portion.

15. The display device of claim 14, wherein in a folded state, the optical hole overlaps the optical element, and the printed layer surrounds the optical element.

16. The display device of claim 15, wherein the optical hole has an elliptical shape in the plan view.

17. The display device of claim 13, wherein the fourth maximum width of the through hole is in a range of about 3 to about 4 mm, and the third maximum width of the through hole is in a range of about 2.7 to about 3.8 mm.

18. A foldable display device including a display panel, the display device comprising:
    a folding line extending in a first direction;
    a first non-folding area disposed on a first side of the folding line and which extends in a second direction perpendicular to the first direction;
    a second non-folding area disposed on a second side of the folding line opposite the first side and which extends in the second direction;

a through hole defined in the first non-folding area and which penetrates the display panel in a thickness direction, and
an optical element disposed to overlap an inside of the through hole in a plan view,
wherein the through hole includes a first inner wall and a second inner wall facing each other,
the first inner wall is disposed closer to the folding line than the second inner wall, and
a first interval between the optical element and the first inner wall is greater than a second interval between the optical element and the second inner wall.

\* \* \* \* \*